(12) United States Patent
Ide et al.

(10) Patent No.: US 11,978,655 B2
(45) Date of Patent: *May 7, 2024

(54) SUBSTRATE TRANSFER MECHANISM AND SUBSTRATE TRANSFERRING METHOD

(71) Applicant: Tokyo Electron Limited, Tokyo (JP)

(72) Inventors: Kousei Ide, Kumamoto (JP); Naruaki Iida, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/201,270

(22) Filed: May 24, 2023

(65) Prior Publication Data

US 2023/0298927 A1  Sep. 21, 2023

Related U.S. Application Data

(63) Continuation of application No. 17/679,352, filed on Feb. 24, 2022, now Pat. No. 11,705,359.

(30) Foreign Application Priority Data

Feb. 25, 2021 (JP) .................................. 2021-029104
Sep. 6, 2021 (JP) .................................. 2021-144921

(51) Int. Cl.
*H01L 21/677* (2006.01)
*B65G 47/90* (2006.01)
(Continued)

(52) U.S. Cl.
CPC ........ *H01L 21/68707* (2013.01); *B65G 47/90* (2013.01); *H01L 21/67178* (2013.01); *H01L 21/67712* (2013.01)

(58) Field of Classification Search
CPC ......... H01L 21/68707; H01L 21/67178; H01L 21/67712; B25J 9/042; B25J 9/043
See application file for complete search history.

(56) References Cited

U.S. PATENT DOCUMENTS 5,664,254 A * 9/1997 Ohkura ............. H01L 21/67781
  414/152
5,913,722 A * 6/1999 Katou ...................... B25J 9/042
  414/940

(Continued)

FOREIGN PATENT DOCUMENTS

JP  2002305230 A  * 10/2002
JP  2005101080 A  *  4/2005
JP  2008-028134 A  2/2008

*Primary Examiner* — Gerald McClain
(74) *Attorney, Agent, or Firm* — Venjuris, P.C.

(57) ABSTRACT

A substrate transfer mechanism includes: an arm base main body provided with a first driver; a lift configured to move up and down the arm base main body; a first arm extending transversely from a lower side of the arm base main body, and having a tip end that pivots around a vertical axis with respect to the arm base main body by the first driver; a second arm extending transversely from an upper side of the tip end of the first arm, and having a tip end that pivots around a vertical axis with respect to the first arm along with the pivoting of the first arm; and a substrate holder provided on an upper side of the tip end of the second arm, and configured to rotate around a vertical axis with respect to the second arm.

8 Claims, 15 Drawing Sheets

(51) Int. Cl.
   *H01L 21/67*      (2006.01)
   *H01L 21/687*     (2006.01)

(56) References Cited

U.S. PATENT DOCUMENTS

| | | | | |
|---|---|---|---|---|
| 6,050,389 | A * | 4/2000 | Lida | H01L 21/67742 |
| | | | | 198/464.4 |
| 6,105,727 | A * | 8/2000 | Nakao | B66F 9/07 |
| | | | | 187/250 |
| 6,116,841 | A * | 9/2000 | Iwasaki | H01L 21/67766 |
| | | | | 414/416.01 |
| 7,819,658 | B2 * | 10/2010 | Sakata | H01L 21/67769 |
| | | | | 118/728 |
| 8,441,618 | B2 * | 5/2013 | Nakaharada | H01L 21/67748 |
| | | | | 355/72 |
| 8,655,429 | B2 * | 2/2014 | Kuduvalli | B25J 9/1682 |
| | | | | 600/407 |
| 9,184,071 | B2 * | 11/2015 | Ogura | B05C 11/08 |
| 10,083,851 | B2 * | 9/2018 | Inada | H01L 21/68707 |
| 11,065,760 | B2 * | 7/2021 | Ho | B25J 9/044 |
| 11,456,198 | B2 * | 9/2022 | Bae | H01L 21/67748 |
| 2006/0120833 | A1 * | 6/2006 | Bonora | H01L 21/67766 |
| | | | | 414/217 |
| 2018/0009111 | A1 * | 1/2018 | Ho | B25J 18/04 |
| 2023/0021035 | A1 * | 1/2023 | Akimoto | H01L 21/67715 |

\* cited by examiner

SUBSTRATE TRANSFER MECHANISM AND SUBSTRATE TRANSFERRING METHOD

CROSS-REFERENCE TO RELATED APPLICATIONS

This application is a continuation application of U.S. patent application Ser. No. 17/679,352, filed on Feb. 24, 2022, which claims priority from Japanese Patent Application Nos. 2021-029104 and 2021-144921, filed on Feb. 25, 2021 and Sep. 6, 2021, respectively, with the Japan Patent Office, all of which are incorporated herein in their entireties by reference.

TECHNICAL FIELD

The present disclosure relates to a substrate transfer mechanism and a substrate transferring method.

BACKGROUND

A substrate processing apparatus used for manufacturing semiconductor devices includes, for example, a plurality of processing modules that processes a semiconductor wafer (hereinafter, referred to as a wafer) which is a substrate. In the substrate processing apparatus, a substrate transfer mechanism is provided to deliver the wafer to each processing module.

Japanese Laid-Open Patent Publication No. 2008-028134 discloses a multi-joint substrate transfer mechanism called a selective compliance assembly robot arm (SCARA). The substrate transfer mechanism includes a plurality of arms (link bodies) 41a to 41c that are connected to each other in an order in the direction from the proximal end to the tip end, and the arms are stacked in the order of 41a, 41b, and 41c.

SUMMARY

According to the present disclosure, a substrate transfer mechanism for transferring a substrate to each of a plurality of stacked processing modules that process the substrate includes: an arm base main body provided with a first driver; a lift configured to move up and down the arm base main body; a first arm extending transversely from a lower side of the arm base main body, and having a tip end that pivots around a vertical axis with respect to the arm base main body by the first driver; a second arm extending transversely from an upper side of the tip end of the first arm, and having a tip end that pivots around a vertical axis with respect to the first arm along with the pivoting of the first arm; and a substrate holder provided on an upper side of the tip end of the second arm, and configured to rotate around a vertical axis with respect to the second arm.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
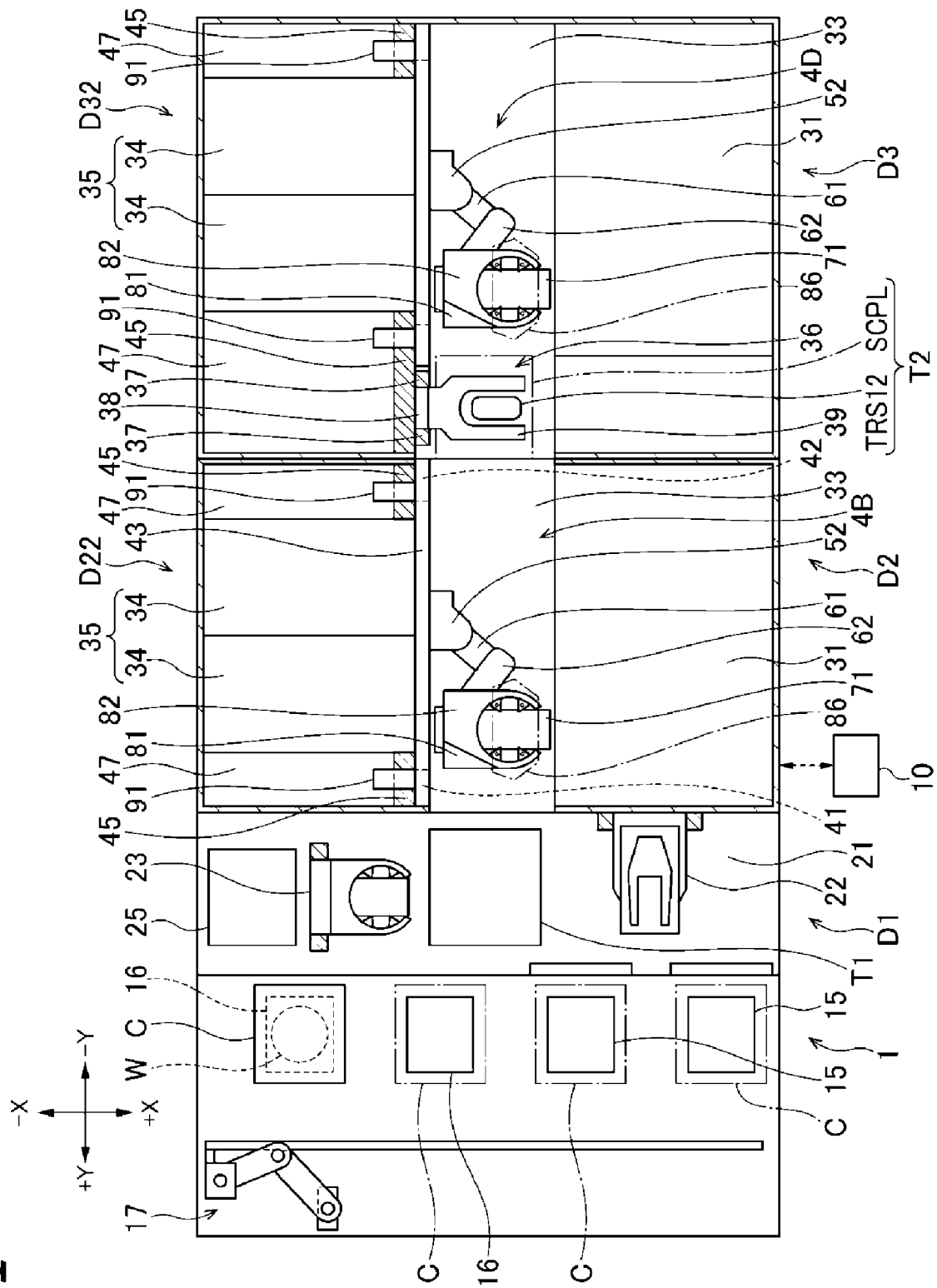
FIG. 1 is a plan view of a substrate processing apparatus including a substrate transfer mechanism according to an embodiment of the present disclosure.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

First Embodiment

A substrate processing apparatus 1 will be described as an example of a substrate processing apparatus including an embodiment of a substrate transfer mechanism of the present disclosure, with reference to the horizontal sectional plan view of FIG. 1 and the vertical sectional front view of FIG. 2. In the substrate processing apparatus 1, a carrier block D1, a first processing block D2, and a second processing block D3 are arranged in this order linearly in the horizontal direction. In the descriptions herein below, the arrangement direction of the blocks D1 to D3 will be referred to as a Y direction, the side of the carrier block D1 in the Y direction will be referred to as a +Y side, and the side of the second processing block D3 in the Y direction will be referred to as a −Y side. The traverse direction orthogonal to the Y direction will be referred to as an X direction, and when the side of the carrier block D1 relative to the X direction is viewed as the left side, and the side of the second processing block D3 relative to the X direction is viewed as the right side, the front side will be referred to as a +X side, and the rear side will be referred to as a −X side.

Each of the first processing block D2 and the second processing block D3 is vertically partitioned into two blocks. The lower and upper blocks of the partitioned first processing block D2 will be referred to as a first lower processing block D21 and a first upper processing block D22, respectively. The lower and upper blocks of the partitioned second processing block D3 will be referred to as a second lower processing block D31 and a second upper processing block D32, respectively. A wafer W is transferred in the order of the carrier block D1→the first lower processing block D21→the second lower processing block D31→the second upper processing block D32→the first upper processing block D22→the carrier block D1. The wafer W is transferred in this way so that an underlayer film, an interlayer film, and a resist film are formed and stacked in this order on the wafer W. After each film is formed, the wafer W is subjected to a heating processing.

Hereinafter, each block will be described. The carrier block D1 performs carry in/out of the wafer W with respect to a carrier C configured to store the wafer W. The side surface of a housing 11 of the carrier block D1 on the +Y side protrudes toward the +Y side to form three tiers, and the tiers are configured as supports 12, 13, and 14, respectively, from below. Each of the supports 12 to 14 is provided with four stages for carriers C, and the four stages are arranged in the X direction. The two stages of each of the supports 12 and 13 on the +X side are configured as stages 15 on which the carriers C are placed for carrying in/out the wafers W with respect to the apparatus. The other stages are configured as stages 16 for carrying in/out the carriers C with respect to the substrate processing apparatus 1 or temporarily retreating the carriers C when the carriers C is not able to be moved to and placed on movement/placement destinations. A movement/placement mechanism 17 is provided to perform the movement/placement of carriers C between the stages 15 and 16.

A transfer region 21 for the wafer W is formed in the housing 11 of the carrier block D1. Transfer mechanisms 22 and 23 are provided on the +X side and the −X side of the transfer region 21, respectively, and a module stacked body T1 is interposed between the transfer mechanisms 22 and 23 in a plan view. The module stacked body T1 is configured in the manner that a transfer module TRS on which the wafer W is temporarily placed, and a temperature adjustment module SCPL that adjusts the temperature of the placed wafer W overlap with each other in the vertical direction. Further, a hydrophobization processing module 25 is provided on the −X side relative to the transfer mechanism 23 in the transfer region 21 to perform the hydrophobization processing of the wafer W.

Next, the first processing block D2 will be described. The front side of the first processing block D2 is vertically partitioned into eight sections, which will be referred to as E1 to E8, respectively, from below to above. The lower sections E1 to E4 are included in the first lower processing block D21, and the upper sections E5 to E8 are included in the first upper processing block D22.

Figure 3:
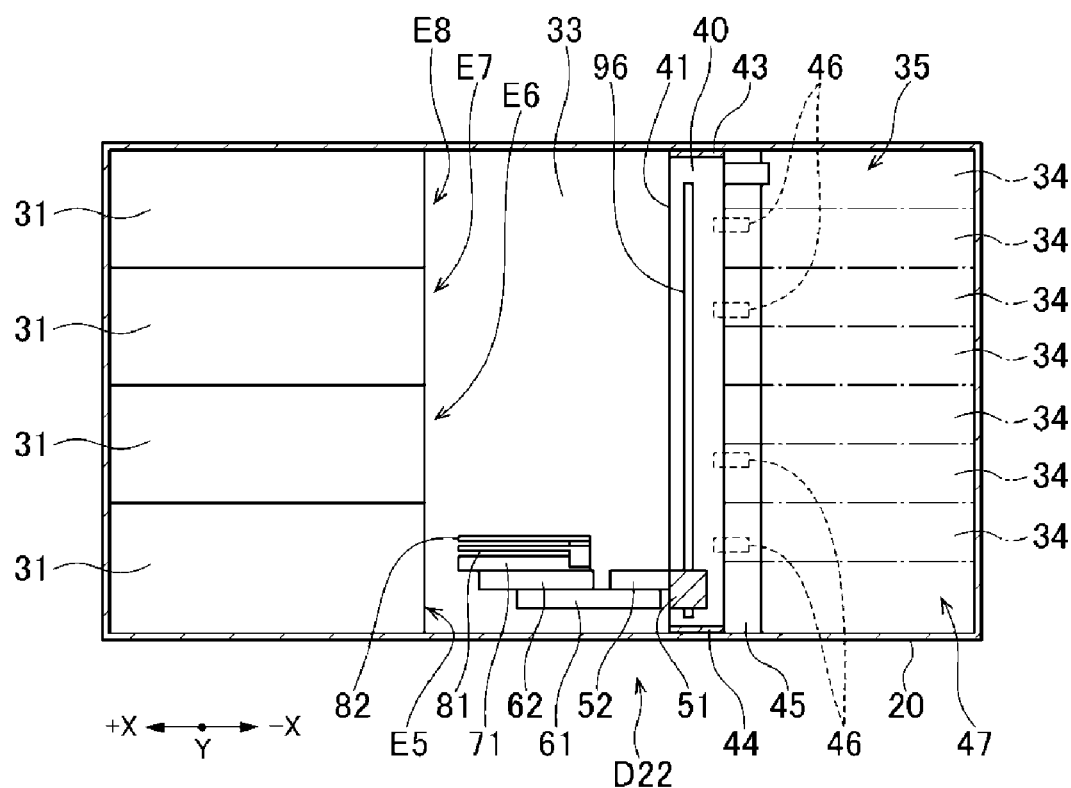
FIG. 3 is a side view of a processing block of the substrate processing apparatus.

The first upper processing block D22 will be described with reference to FIG. 3 which is a vertical sectional side view. The first upper processing block D22 includes an angular housing 20 that partitions the first upper processing block D22 from the other blocks. The sections E5 to E8 described above or processing modules and a transfer mechanism 4B to be described later are provided in the housing 20.

The sections E5 to E8 are provided with resist film formation modules 31, respectively, that form a resist film by applying a resist as a chemical liquid. Accordingly, the resist film formation modules 31 are a plurality of stacked processing modules. A transfer region 33 for the wafer W is provided behind the sections E5 to E8 to extend in the Y direction. Heating modules 34 are provided as processing modules behind the transfer region 33. Seven heating modules 34 are vertically stacked to form a stacked body, and two stacked bodies are arranged side by side in the Y direction. The plurality of heating modules 34 arranged vertically in two rows may be collectively referred to as a heating module group 35.

The heating module group 35 and the resist film formation modules 31 of the sections E5 to E8 face each other with the transfer region 33 interposed therebetween. The transfer mechanism 4B is provided in the transfer region 33 to deliver the wafer W to/from the resist film formation modules 31 and the heating modules 34. Accordingly, the stacked processing modules share the transfer mechanism 4B. The detailed configuration of the transfer mechanism 4B will be described later.

The first lower processing block D21 of the first processing block D2 has the same configuration as that of the first upper processing block D22, except that the sections E1 to E4 are provided with chemical liquid application modules that apply a chemical liquid for forming the underlayer film. Next, the second processing block D3 (the second upper processing block D32 and the second lower processing block D31) will be described, and since the second processing block D3 has substantially the same configuration as that of the first processing block D2, only differences will be described. The sections E5 to E8 of the second upper processing block D32 are provided with chemical liquid application modules for forming the interlayer film. The sections E1 to E4 of the second lower processing block D31 is not provided with chemical liquid application modules, and are provided with only the heating modules 34 as processing modules in the same manner as the other processing blocks. FIG. 2 illustrates the transfer mechanisms that correspond to the transfer mechanisms 4B provided in the first lower processing block D21, the second lower processing block D31, and the second upper processing block D32, as 4A, 4C, and 4D, respectively.

TRS11 and TRS12 are provided at the ends of the transfer regions 33 of the second lower processing block D31 and the second upper processing block D32, respectively, on the +Y side. The TRS11 and the TRS12 overlap each other in a plan view. Further, an upward/downward movement and placement mechanism 36 is provided to move up and down along the end of the transfer region 33 of each block on the +Y side, and transfer the wafer W between the TRS11 and the TRS12. The upward/downward movement and placement mechanism 36 includes support columns 37 that extend vertically on the rear side of the transfer region 33, a horizontal rotary shaft 38 that is movable up and down along the support columns 37 and extends in the Y direction, and a holder 39 that extends in the direction orthogonal to the extending direction of the rotary shaft 38 to adsorb and hold the back surface of the wafer W. For the convenience of illustration, FIG. 2 illustrates that the rotary shaft 38 extends in the X direction. By the rotation of the rotary shaft 38, the tip end of the holder 39 faces upward while moving up and down between the TRS11 and the TRS12, and faces sideward while delivering the wafer W to each of the TRS11 and the TRS12. Further, SCPLs are provided in the second lower processing block D31 and the second upper processing block D32, respectively, to overlap with the TRS11 and the TRS12. The TRS11, the TRS12, and the SCPLs make up a module stacked body T2.

Figure 2:
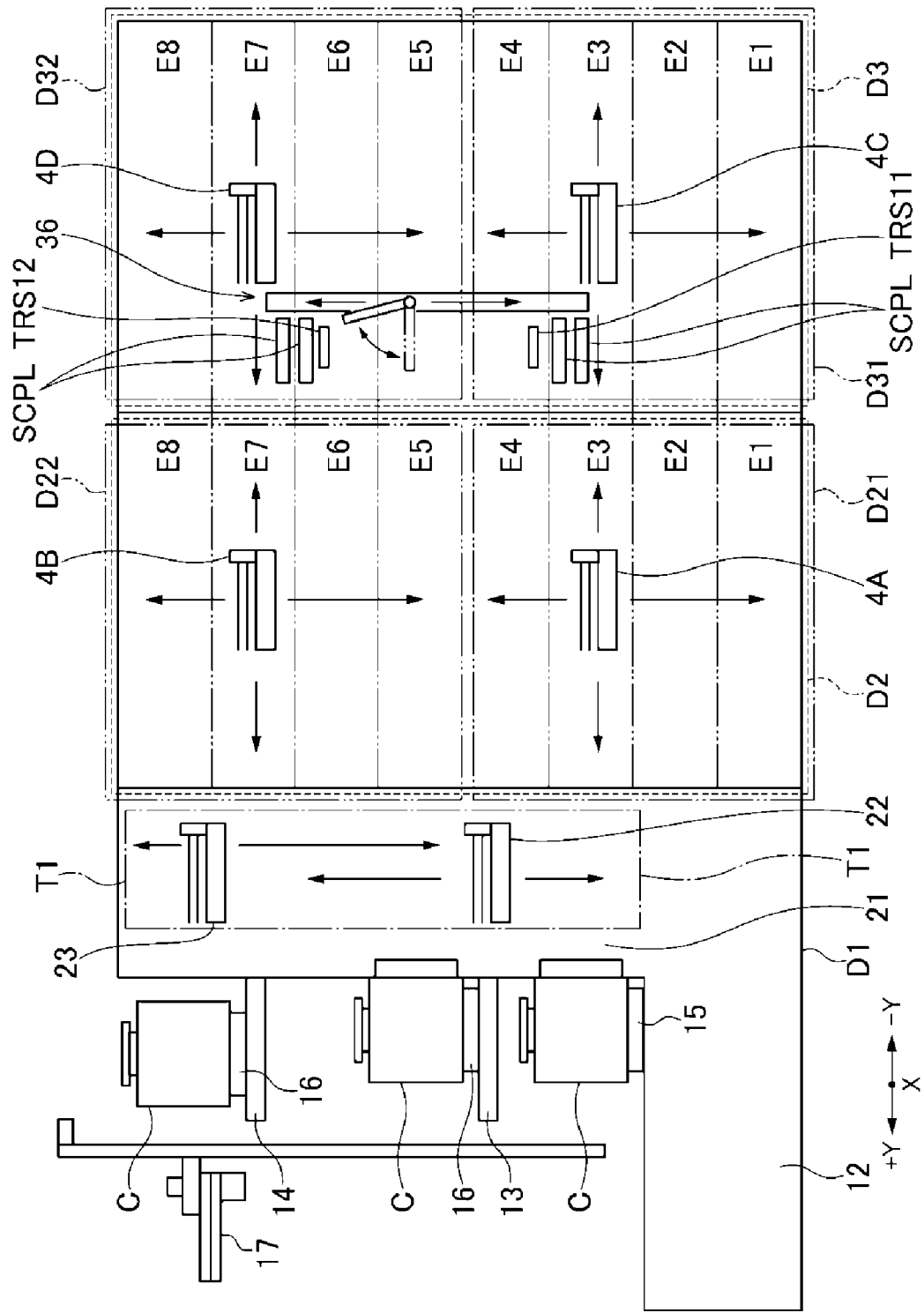
FIG. 2 is a front view of the substrate processing apparatus.

The substrate processing apparatus 1 further includes a controller 10 (see FIG. 1). The controller 10 is configured with a computer, and includes a program, a memory, and a CPU. The program includes a step group for performing a series of operations in the substrate processing apparatus 1 to be described later. According to the program, the controller 10 outputs a control signal to each unit of the substrate processing apparatus 1, so that the operation of each unit is controlled. Specifically, the transfer of the wafer W by the transfer mechanisms 4A to 4D and the upward/downward movement and placement mechanism 36, and the operation of each of the processing modules such as the heating modules 34 are controlled. The program described above is installed in the controller 10 by being stored in a storage medium such as a compact disk, a hard disk, or a DVD.

Next, the transfer route of the wafer W in the substrate processing apparatus 1 will be described. The wafer W of the carrier C on the stage 15 is transferred in the order of the transfer mechanism 22→the TRS of the module stacked body T1→the transfer mechanism 23→the hydrophobization processing module 25→the SCPL of the module stacked body T1. Then, the wafer W is taken into the first lower processing block D21 by the transfer mechanism 4A, transferred in the order of the chemical liquid application module→the heating module 34 so that the underlayer film is formed. Then, the wafer W is transferred to the SCPL of the module stacked body T2, transferred to the heating module 34 by the transfer mechanism 4C of the second lower processing block D31 to be further subjected to the heating processing, and then, transferred to the TRS11.

Then, the wafer W is transferred to the TRS12 of the second upper processing block D32 by the upward/downward movement and placement mechanism 36, transferred in the order of the SCPL of the module stacked body T2→the chemical liquid application module→the heating module 34 by the transfer mechanism 4D so that the interlayer film is formed, and transferred to the SCPL of the module stacked body T2. Subsequently, the wafer W is taken into the first upper processing block D22 by the transfer mechanism 4B, transferred in the order of the resist film formation module 31→the heating module 34 so that the resist film is formed, and transferred in this state to the TRS of the module stacked body T1. Then, the wafer W is transferred in the order of the transfer mechanism 23→the TRS of the module stacked body T1→the transfer mechanism 22 to be returned to the carrier C.

Figure 4:
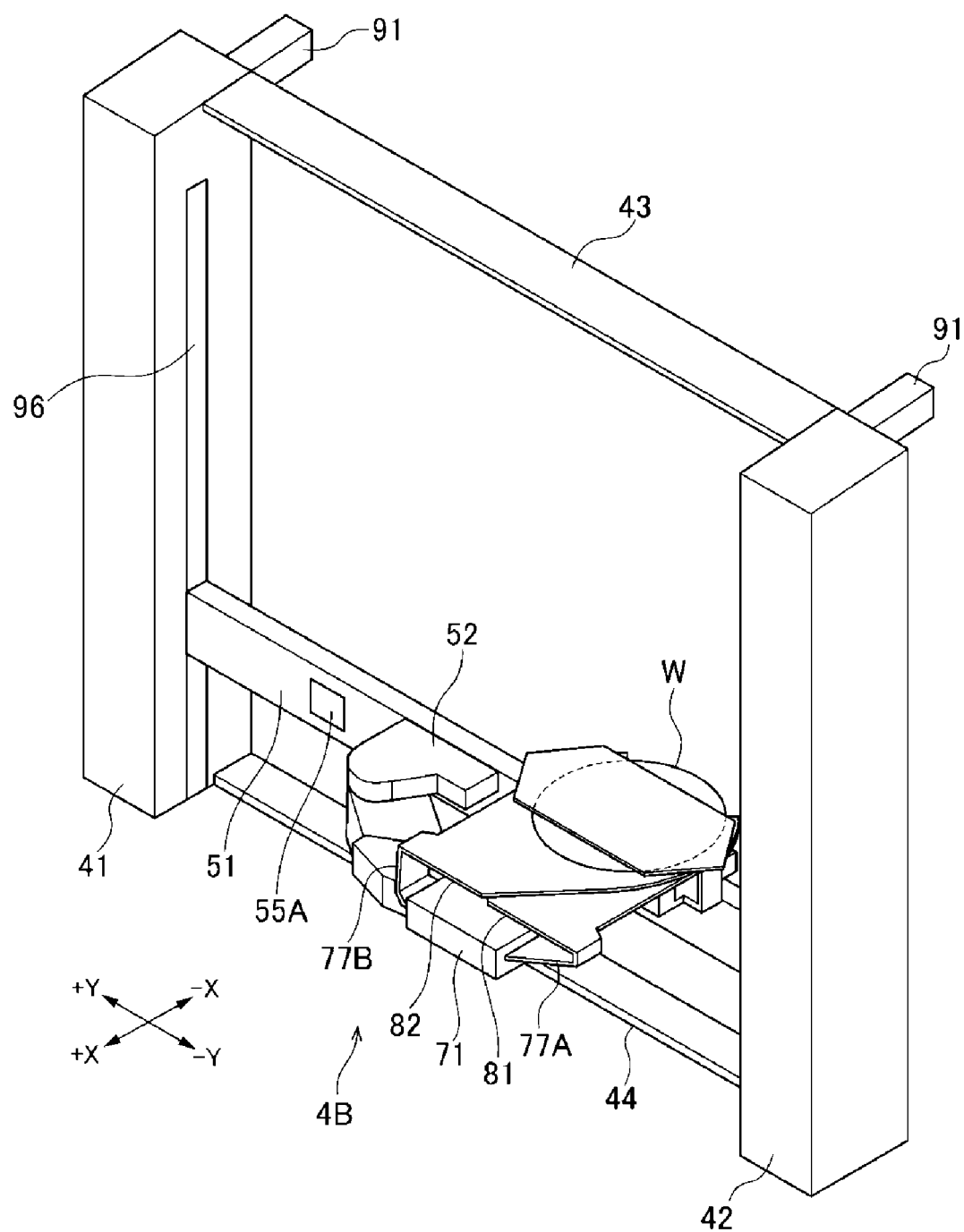
FIG. 4 is an entire perspective view of the substrate transfer mechanism.

Next, the transfer mechanisms 4A to 4D which are substrate transfer mechanisms will be described. Since the transfer mechanisms 4A to 4D have the same configuration, the transfer mechanism 4B in the first upper processing block D22 will be described as a representative with reference to the perspective view of FIG. 4, the front view of FIG. 5, and the vertical sectional side view of FIG. 6. As described above regarding the transfer route of the wafer W, the transfer mechanism 4B transfers the wafer W to/from the TRS of the module stacked body T1, the SCPL of the module stacked body T2, the resist film formation module 31, and the heating module 34 which are arranged on the +Y side, the −Y side, the +X side, and the −X side, respectively, relative to the transfer region 33.

The transfer mechanism 4B includes support columns 41 and 42, an upper beam 43, a lower beam 44, a slider 51, an arm base main body 52, a first arm 61, a second arm 62, a base 71, a lower fork 81, and an upper fork 82. The support columns 41 and 42, the upper beam 43, and the lower beam 44 make up a lift to move up and down the slider 51 and the arm base main body 52 which make up an arm base. The support columns 41 and 42 extend longitudinally, more specifically, vertically at the end of the transfer region 33 on the −X side. The support column 41 which is a first support column is disposed on the +Y side relative to the heating module group 35, and the support columns 42 which is a second support column is disposed on the −Y side relative to the heating module group 35.

The upper beam 43 and the lower beam 44 extend transversely, more specifically, for example, horizontally, and are configured as a flat plate elongated, for example, in the Y direction. One end and the other end of the upper beam 43 are connected to the upper end of the support column 41 and the upper end of the support column 42, respectively, and one end and the other end of the lower beam 44 are connected to the lower end of the support column 41 and the lower end of the support column 42, respectively. The upper beam 43 is disposed above the movement region of the slider 51 that moves up and down as described later, and the lower beam 44 is disposed behind the movement region not to interfere with the movement region.

The upper sides of the support columns 41 and 42 are connected to each other, and the lower sides of the support columns 41 and 42 are connected to each other, by the upper beam 43 and the lower beam 44, respectively, so that the relatively high rigidity of the support columns 41 and 42 are ensured. As a result, the deformation or shaking of the support columns 41 and 42 is suppressed, and the wafer W may be transferred to an exact position in a module. Further, as a result of the connection of the support columns 41 and 42, the positional deviation between the support columns 41 and 42 is prevented, so that when each part of the transfer mechanism 4B supported by the support columns 41 and 42 is assembled, the positional accuracy of the part may be improved.

A frame is provided in the housing 20 of the first upper processing block D22 to attach, for example, the modules, and fixed to the housing 20. In the frame, the portions that extend longitudinally are illustrated as longitudinally extending portions 45 in FIGS. 1 and 3, and disposed behind the support columns 41 and 42, respectively. The support columns 41 and 42 are connected to the longitudinally extending portions 45, respectively, by fixing tools 46 such as, for example, bolts with intervals along the length direction. In this way, the support columns 41 and 42 are fixed to the housing 20 along the length direction thereof, and as a result, the relatively high rigidity is ensured as described above. In the housing 20, regions 47 are provided behind the support columns 41 and 42 to be partitioned from the transfer region 33 and the heating module group 35. Accordingly, the partitioned regions 47 are partitioned from the processing modules, and the rear sides of the longitudinally extending portions 45 face the partitioned regions 47. In the partitioned regions 47, auxiliary facilities related to the modules are provided, such as an exhaust duct connected to the modules or electric equipment for operating the modules.

Hereinafter, the schematic configuration of the slider 51, the arm base main body 52, the first arm 61, the second arm 62, and the base 71 will be described. The slider 51 is provided between the support columns 41 and 42 to extend transversely, specifically, for example, horizontally. The slider 51 is configured as a beam-shaped body of which one end and the other end are connected to and supported by the support columns 41 and 42, respectively. Although the mechanism of the support columns 41 and 42 will be described later, the support columns 41 and 42 may move up and down the slider 51 in the longitudinal direction which is the extending direction of the support columns 41 and 42, more specifically, in the vertical direction.

The arm base main body 52 is connected to the slider 51, and protrudes from the upper end of the center of the slider 51 in the extending direction thereof (the Y direction) toward the +X side, that is, toward the direction crossing the Y direction. The proximal end of the first arm 61 is connected to the lower side of the arm base main body 52 to be rotatable around the longitudinal axis, more specifically, for example, the vertical axis, and the tip end of the first arm 61 extends transversely, more specifically, for example, horizontally. Accordingly, the tip end of the first arm 61 is pivotable around the vertical axis with respect to the arm base main body 52.

The proximal end of the second arm 62 is connected to the upper side of the tip end of the first arm 61 to be rotatable around the longitudinal axis, more specifically, for example, the vertical axis, and the tip end of the second arm 62 extends transversely, more specifically, for example, horizontally. Accordingly, the tip end of the second arm 62 is pivotable around the vertical axis with respect to the first arm 61. The base 71 is connected to the upper side of the tip end of the second arm 62 to be rotatable around the longitudinal axis, more specifically, for example, the vertical axis with respect to the tip end of the second arm 62. The base 71 is positioned above the second arm 62, and also positioned above the arm base main body 52. The forks 81 and 82 (the lower fork 81 and the upper fork 82) each capable of absorbing and holding the wafer W are arranged side by side in the vertical direction on the base 71. Accordingly, the forks 81 and 82 which are holders of the wafer W are provided to be rotatable on the upper side of the tip end of the second arm 62. The base 71 may advance and retreat the lower fork 81 which is a first holder and the upper fork 82 which is a second holder, independently from each other, with respect to the base 71.

The transfer mechanism 4B is configured as the SCARA type transfer arm by including the first arm 61 and the second arm 62 that are independently rotatable as described above, and the rotating movement causes the base 71 to move to the vicinity of the module to which the wafer W is to be delivered. Then, by the advancing/retreating movement of the forks 81 and 82, the wafer W is delivered to the module. The arm base main body 52 is provided with a motor 53 which is a first driver, and the driving force of the motor 53 is transmitted to the first arm 61 and the second arm 62 via power transmission mechanisms including pulleys and belts to be described later, so that the first arm 61 and the second arm 62 rotate together. That is, the first arm 61 and the second arm 62 share the motor 53, and the second arm 62 rotates in synchronization with the rotation of the first arm 61.

Various types of cables for driving each part of the transfer mechanism 4B and absorption pipes 85A and 85B (hereinafter, referred to as cables) are routed by using the space formed inside each of the second arm 62, the first arm 61, the arm base main body 52, the slider 51, the support columns 41 and 42. That is, an installation space of the cables is provided from the second arm 62 to the inside of the support columns 41 and 42 through the first arm 61, the arm base main body 52, and the slider 51 in this order. The installation space is formed in the housing that makes up each of the second arm 62, the first arm 61, and the arm base main body 52 as described later. A gap is formed in the surface of the housing to be connected to the installation space. For example, as described later, the gap of the housing is formed between a member provided to penetrate the wall of the housing and the wall of the housing.

In the installation space of the cables, the region from the second arm 62 to the slider 51 is exhausted by an exhaust mechanism provided in the slider 51, and the gap of the surface of the housing has a negative pressure with respect to the transfer region 33. Thus, the atmosphere in the transfer region 33 flows to the exhaust mechanism through the gap of the housing and the installation space of the cables. Accordingly, even when particles are generated from the power transmission mechanism provided in the housing to include pulleys and a belt, the particles are prevented from scattering into the transfer region 33 through the gap of the housing, by the exhausting of the atmosphere.

Figure 6:
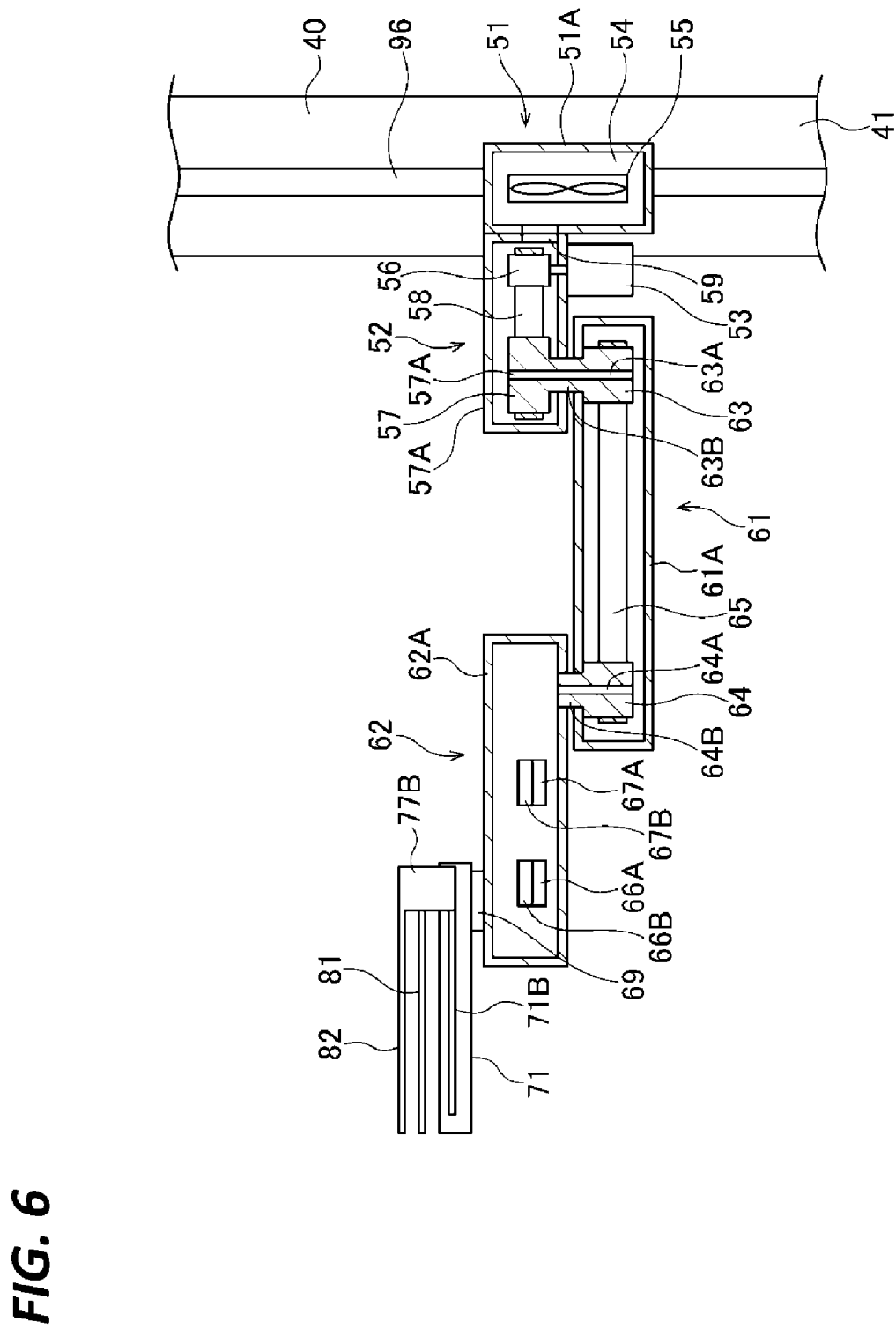
FIG. 6 is a vertical sectional side view of the substrate transfer mechanism.

The slider 51 also includes a housing (indicated as 51A in FIG. 6). A space 54 in the housing 51A serves as the installation space of the cables described above, and the space 54 extends along the length direction of the slider 51. In the front surface of the slider 51, openings 55A are formed on the +Y side and -Y side, respectively, relative to the position where the arm base main body 52 is provided, and fans 55 are provided as the exhaust mechanism described above to overlap with the openings 55A, respectively. Each fan 55 includes a filter, and the atmosphere exhausted as described above passes through the filter and is returned to the transfer region 33 through the openings 55A in a clean state (particle-free state).

Figure 7:
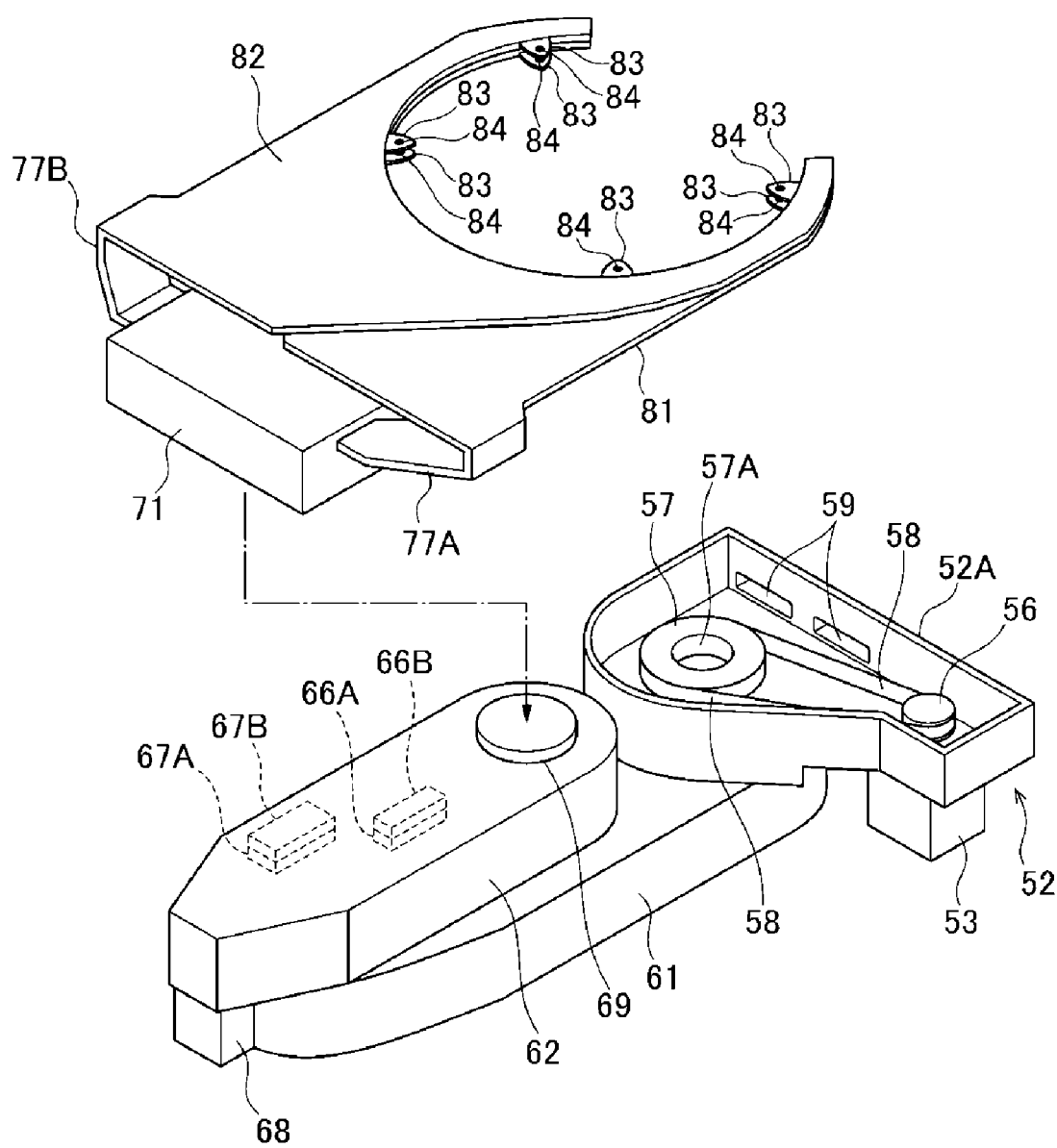
FIG. 7 is a perspective view of the substrate transfer mechanism.

Hereinafter, the arm base main body 52 will be described with reference to FIG. 7 which is a perspective view taken by cutting out the upper end of the arm base main body 52. The arm base main body 52 includes a housing 52A, and the motor 53 described above is provided at the position shifted in the -Y direction from the position to which the first arm 61 is connected, on the lower side of the housing 52A. In the housing 52A which is a housing for the arm base main body, pulleys 56 and 57 are provided apart from each other in the Y direction to be rotatable around the vertical axis, and an endless belt 58 wraps around the pulleys 56 and 57. The pulley 56 is connected to the motor 53. A through hole 57A is formed at the center of the pulley 57 along the axial direction of the pulley 57, and the upper side of the through hole 57A is opened in the housing 52A. Further, communication holes 59 are opened in the rear wall of the housing 52A, and connected to the space 54 in the slider 51 described above.

Next, the first arm 61 will be described. The first arm 61 includes a housing 61A (see FIG. 6). In the housing 61A which is a housing for the first arm, pulleys 63 and 64 are provided close to the proximal end and the tip end of the first arm 61, respectively, to be rotatable around the vertical axis, and an endless belt 65 wraps around the pulleys 63 and 64. Through holes 63A and 64A are formed at the centers of the pulleys 63 and 64, respectively, along the axial directions of the pulleys 63 and 64.

The lower side of the through hole 63A of the pulley 63 is opened in the housing 61A. The pulley 63 is connected to the upper wall of the housing 61A. The hole edge of the through hole 63A of the pulley 63 protrudes upward, and penetrates the upper portion of the housing 61A and the lower portion of the housing 52A of the arm base main body 52 to be connected to the pulley 57. The pulley 63, a connector 63B, and the pulley 57 are roughly one cylindrical body and rotate all together, and their respective rotating axes are aligned in a plan view. Further, for example, the connector 63B is configured to include a speed reducer such that the gear ratio of the pulleys 63 and 57 (the ratio of the number of rotating times) becomes a predetermined value, and the illustration thereof is omitted. Since the pulley 63 and the housing 61A are connected to each other as described above, the first arm 61 rotates along with the rotation of the pulley 63. The hole edge of the through hole 64A of the pulley 64 also protrudes upward to penetrate the upper wall of the housing 61A, and is configured as a cylindrical connector 64B.

Next, the second arm 62 will be described. The second arm 62 includes a housing 62A. The cylindrical connector 64B described above is connected to the lower surface of the housing 62A, and the inside of the connector 64B communicates with the inside of the housing 62A. As a result of the connection through the connector 64B, the second arm 62 rotates along with the rotation of the pulley 64. Valves 66A and 66B which are, for example, solenoid valves, and pressure sensors 67A and 67B are provided in the housing 62A which is a housing for the second arm, and details thereof will be described later. A motor 68 is provided on the lower side of the proximal end of the housing 62A, and pivots on the lateral side of the tip end of the first arm 61 by the rotation of the second arm 62. The driving force of the motor 68 is transmitted to the base 71 via power transmission mechanisms for the base 71 configured with pulleys and a belt, so that the base 71 rotates. As for the power transmission mechanisms for rotating the base 71, FIG. 7 illustrates only a pulley 69 provided such that the upper end thereof is connected to the lower side of the base 71.

The pulleys 56, 57, 63, and 64, and the belts 58 and 65 described above are power transmission mechanisms that transmit the driving force of the motor 53 to the first arm 61 and the second arm 62, and the pulleys 56, 57, 63, and 64 rotate all together via the belts 58 and 65 by the driving force of the motor 53. As a result, the first arm 61 and the second arm 62 rotate together with a predetermined rotation ratio as described above. The inside of the housing 62A, the through hole 64A of the pulley 64, the inside of the housing 61A, the through hole 63A of the pulley 63, the through hole 57A of the pulley 57, the inside of the housing 52A, the communication hole 59, and the space 54 is a space (a communication path) exhausted by the fans 55 of the slider 51 which are a second exhaust mechanism, and the atmosphere flows toward the fans 55 in this order to be exhausted. As described above, since the space where the power transmission mechanisms including pulleys and belts are provided is collectively exhausted by the fans 55, the fans 55 do not need to be provided in each housing for the exhausting purpose, so that the manufacturing costs for the transfer mechanism 4B is reduced.

Figure 8:
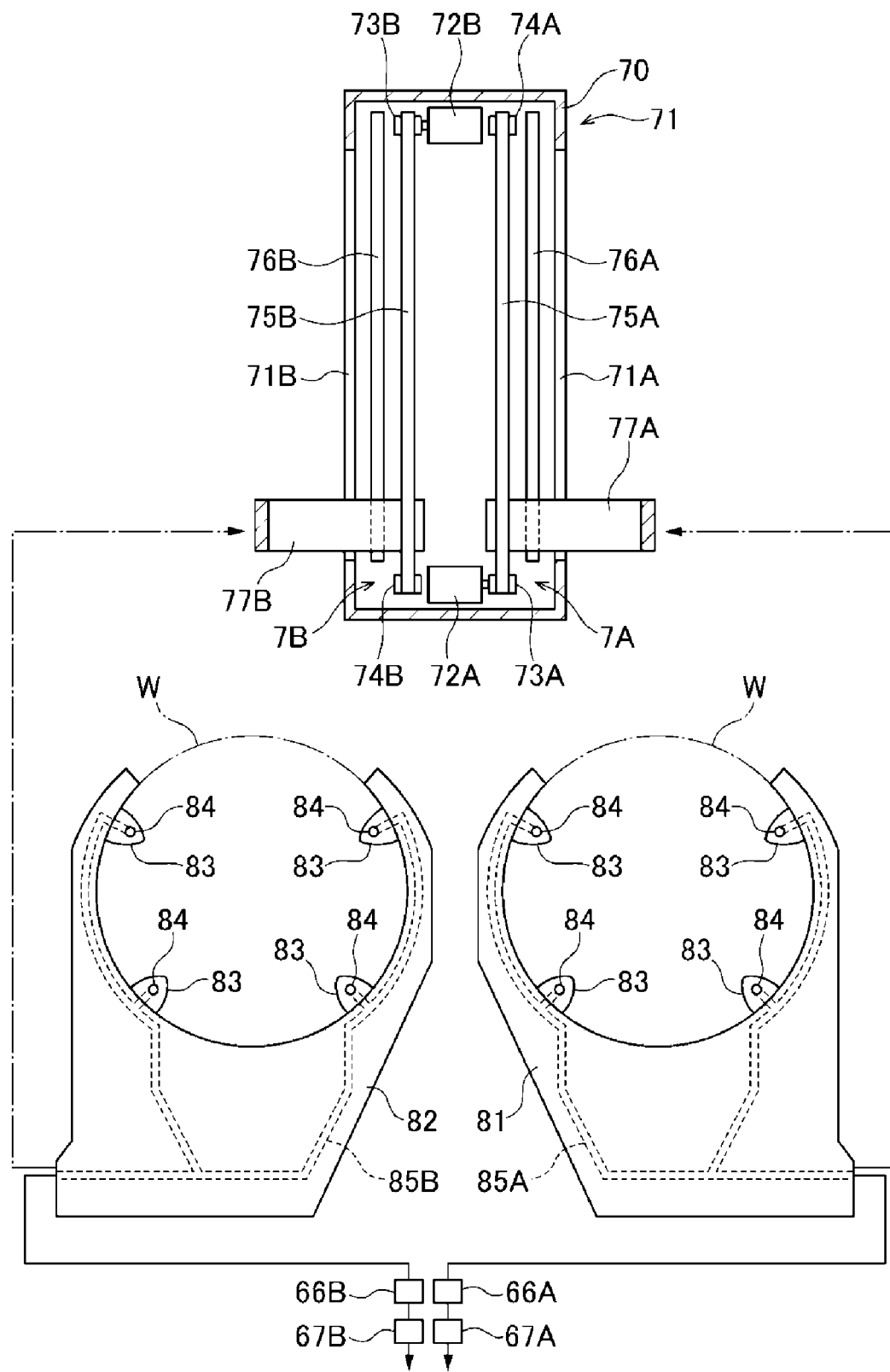
FIG. 8 is a horizontal plan view illustrating a portion of the substrate transfer mechanism.

Next, the base 71 will be described with reference to FIG. 8 which is a horizontal sectional plan view. The base 71 includes a flat angular housing 70, and the housing 70 is configured in a substantially rectangular shape in a plan view. The forks 81 and 82 advance and retreat in the length direction of the rectangle, to move between a retreating position where the holding region of the wafer W in each fork is positioned on the base 71, and an advancing position where the holding region projects forward from the base 71. The forks 81 and 82 overlap with each other at the retreating position. One of the forks 81 and 82 is used for receiving the wafer W from a module, and the other is used for sending the wafer W to a module.

Hereinafter, for the convenience of description of the configuration, the long length direction of the housing 70 may be referred to as the front-rear direction, and the short length direction thereof may be referred to as the left-right direction. The right and left sides of the base 71 are the right and left sides when viewed in the advancing direction of the forks 81 and 82. In the housing 70, a driving mechanism 7A for the lower fork 81 and a driving mechanism 7B for the upper fork 82 are provided. The driving mechanism 7A includes a motor 72A, pulleys 73A and 74A, a belt 75A, a guide 76A, and a connector 77A. The driving mechanism 7B includes a motor 72B, pulleys 73B and 74B, a belt 75B, a guide 76B, and a connector 77B. The pulleys 73A, 74A, 73B, and 74B each rotates around a horizontal rotating axis that extends to the left-right direction. The belts 75A and 75B are endless belts. The guides 76A and 76B are formed to extend horizontally in the front-rear direction.

As for the driving mechanism 7A which is a first advancing and retreating mechanism, the motor 72A is disposed at the center of the rear side of the housing 70 in the left-right direction inside the housing 70. The pulley 73A is disposed on the right side of the motor 72A, the pulley 74A is disposed in front of the pulley 73A, and the belt 75A wraps around the pulleys 73A and 74A. The guide 76A is provided on the right side of the pulleys 73A and 74A and the belt 75A. The left end of the plate-shaped connector 77A is locked between the guide 76A and the belt 75A. The right end of the connector 77A protrudes to the right side (one side of the left and right sides) of the housing 70 through a slit 71A formed in the right surface of the housing 70, and is bent upward outside the housing 70 to be connected to the lower fork 81. With this configuration, the lower fork 81 is supported by the base 71 via the connector 77A and the guide 76A. The belt 75A is driven by the motor 72A, and the connector 77A moves along the length direction of the guide 76A, such that the lower fork 81 connected to the connector 77A advances and retreats.

As for the driving mechanism 7B which is a second advancing and retreating mechanism, the motor 72B is disposed at the center of the front side of the housing 70 in the left-right direction inside the housing 70. The pulley 73B is disposed on the left side of the motor 72B, the pulley 74B is disposed behind the pulley 73B, and the belt 75B wraps around the pulleys 73B and 74B. A guide 76B is provided on the left side of the pulleys 73B and 74B and the belt 75B. The right end of the plate-shaped connector 77B is locked between the guide 76B and the belt 75B. The left end of the connector 77B protrudes to the left side (the other side of the left and right sides) of the housing 70 through a slit 71B formed in the left surface of the housing 70, and is bent upward outside the housing 70 to be connected to the upper fork 82. With this configuration, the upper fork 82 is supported by the base 71 via the connector 77B and the guide 76B. The belt 75B is driven by the motor 72B, and the connector 77B moves along the length direction of the guide 76B, so that the upper fork 82 connected to the connector 77B advances and retreats. A seal belt is provided to close each of the slits 71A and 71B of the base 71, but the illustration thereof is omitted.

As described above, the pulleys 73A and 74A, the belt 75A, the guide 76A, and the connector 77A of the driving mechanism 7A are provided on the right side inside the housing 70. The pulleys 73B and 74B, the belt 75B, the guide 76B, and the connector 77B of the driving mechanism 7B are provided on the left side inside the housing 70. Further, cables (wiring) are connected to the motors 72A and 72B which are each a third driver, to supply an electric power. The upstream side of the cables is drawn out to the housing 62A of the second arm 62 through the installation region provided in the pulley 69 connected to the lower side of the base 71 as described above, and accommodated in the communication path described above. That is, the cables are drawn out from the inside of the housing 70 to the support column 41 or 42 through the inside of the housing 62A, the inside of the housing 61A, the inside of the housing 52A, and the housing 51A in this order.

The lower fork 81 will be described. The lower fork 81 has a plate shape, and its tip end is divided into two parts to extend forward in a substantially horseshoe shape that surrounds the side circumference of the wafer W. Four claws 83 are formed at the tip end of the lower fork 81 that surrounds the wafer W as described above to protrude toward the center of the region that supports the wafer W, and support the back surface of the wafer W. The claws 83 are provided with absorption holes 84, respectively, that absorb the back surface of the wafer W while supporting the wafer W. The upstream ends of the absorption pipe 85A are connected to the absorption holes 84, respectively, and the downstream sides of the absorption pipe 85A merge with each other. The connector 77A is connected to the lower right side of the proximal end of the lower fork 81.

The upper fork 82 has the same configuration as that of the lower fork 81, and the absorption pipe corresponding to the absorption pipe 85A is indicated as 85B. The connector 77B is connected to the lower left side of the proximal end of the upper fork 82.

The merged downstream side of the absorption pipe 85A and the merged downstream side of the absorption pipe 85B are routed in the housing 62A of the second arm 62. A valve 66A and a pressure sensor 67A are provided in this order toward the downstream side in the middle of the absorption pipe 85A, and a valve 66B and a pressure sensor 67B are provided in this order toward the downstream side in the middle of the absorption pipe 85B. The downstream ends of the absorption pipes 85A and 85B are connected to an exhaust source (not illustrated).

When the valve 66A is opened while the lower fork 81 is supporting the wafer W, the back surface of the wafer W is absorbed from the absorption holes 84 of the lower fork 81, and held by the lower fork 81. When the valve 66B is opened while the upper fork 82 is supporting the wafer W, the wafer W is absorbed from the absorption holes 84 of the upper fork 82, and held by the upper fork 82. Further, during the operation of the substrate processing apparatus 1, the pressure sensors 67A and 67B transmit detection signals corresponding to the pressures in the absorption pipes 85A and 85B, respectively, to the controller 10. As a result, the controller 10 may determine the presence/absence of abnormality. The pressure sensors 67A and 67B are provided with a screen 68C that displays detected pressures in the absorption pipes 85A and 85B, respectively (see FIG. 5), and the screen is exposed on the side surface of the housing 62A. A user of the substrate processing apparatus 1 may visually check the screen and perform, for example, a maintenance.

Figure 5:
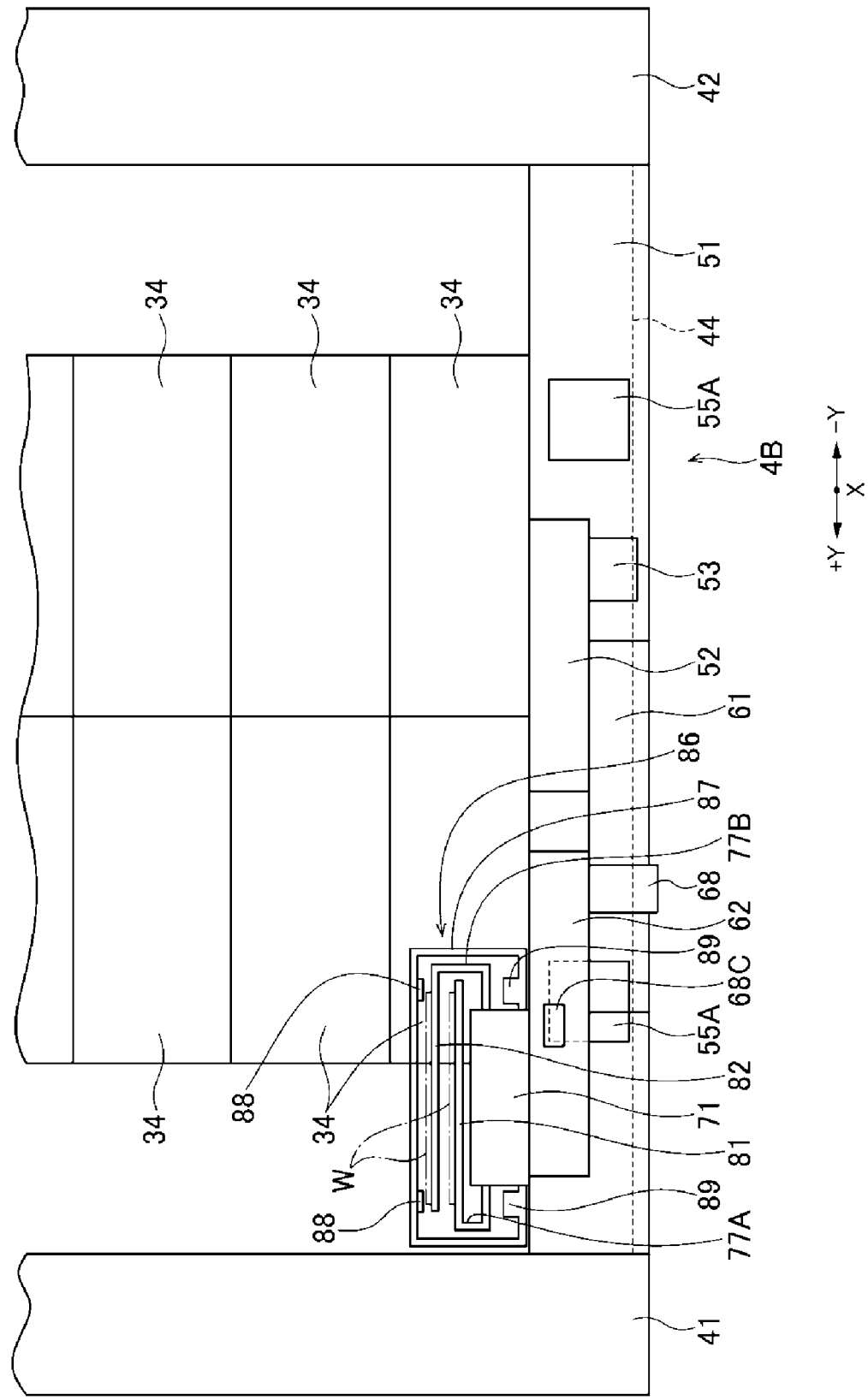
FIG. 5 is a front view of the substrate transfer mechanism.

Further, the base 71 is provided with a position detector 86 that detects the position of the wafer W held on the lower fork 81 or the upper fork 82 at the retreating position with respect to the fork. The position detector 86 includes a support frame 87 formed in a portal shape when the base 71 is viewed in the front-rear direction. The support frame 87 includes a total of four light irradiators 88 that emit light downward toward the peripheral edge of the wafer W, and a total of four light recipients 89 disposed below the light irradiators 89, respectively. The controller 10 detects the position of the wafer W based on the area where each light recipient 89 receives light. For the convenience of illustration, FIG. 5 illustrates only two light irradiators 88 and two light recipients 89. Further, for example, FIGS. 6 to 8 omit the illustration of the position detector 86.

Figure 9:
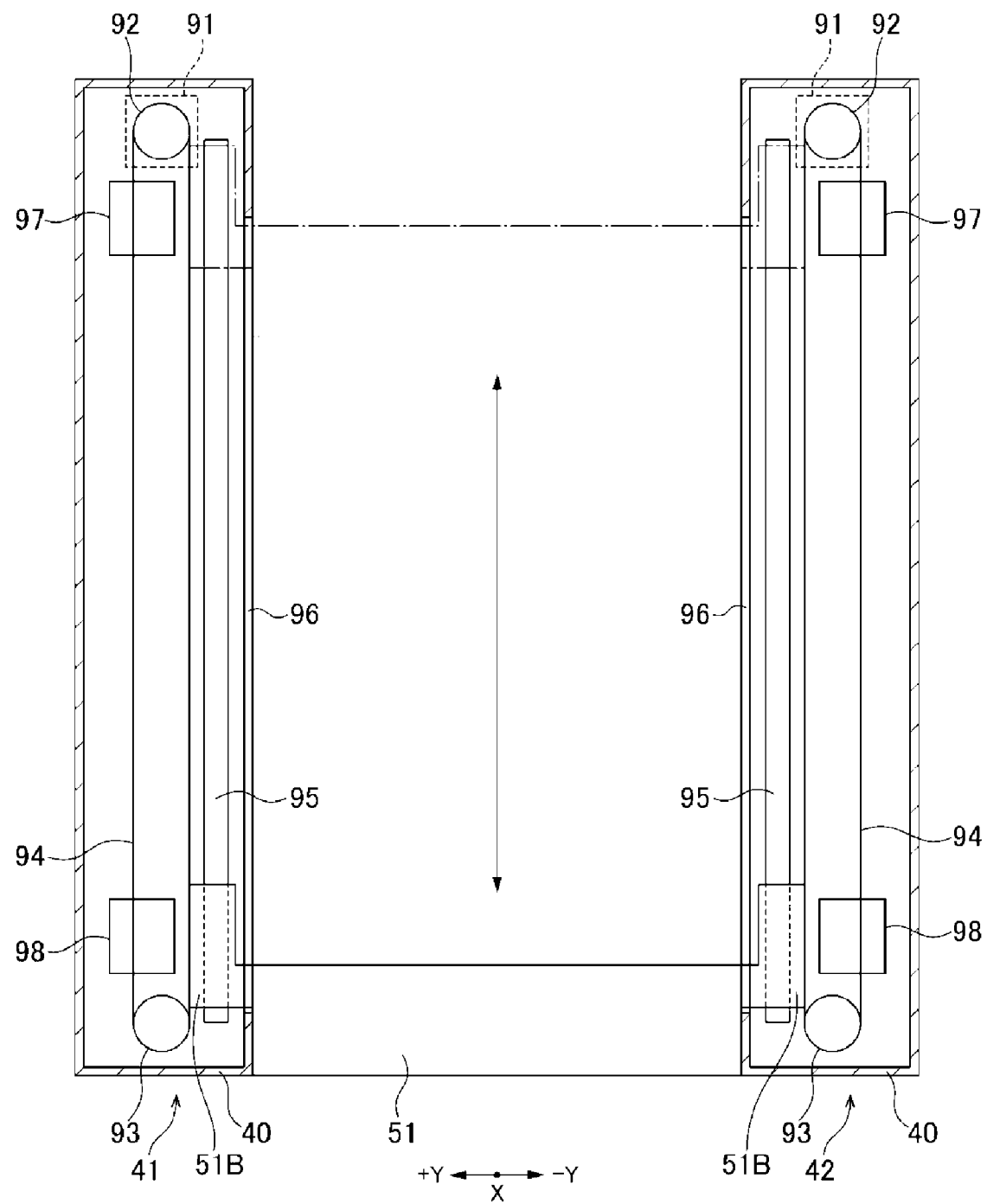
FIG. 9 is a schematic vertical sectional front view illustrating a portion of the substrate transfer mechanism.

Next, the support columns 41 and 42 will be described more in detail with reference to FIG. 9 which is a schematic vertical sectional front view. The support column 41 is configured with a housing 40, and a motor 91 is provided to protrude from the rear side of the upper end of the housing 40. The motor 91 which is a second driver is provided in the partitioned region 47 illustrated in FIG. 1. Pulleys 92 and 93 are provided at the upper and lower ends of the housing 40, respectively, inside the housing 40, and each rotate around a horizontal axis that extends in the front-rear direction. An endless belt 94 wraps around the pulleys 92 and 93. A guide 95 is provided on the −Y side relative to the pulleys 92 and 93 inside the housing 40. The guide 95 is used for moving up and down the slider 51, and extends vertically. A vertically extending slit 96 is formed in the side surface of the housing 40 on the −Y side. A vertically extending connector 51B that serves as the end of the slider 51 on the +Y side is provided in the housing 40 by entering the housing 40 through the slit 96, and locked and supported between the belt 94 and the guide 95. The slit 96 is also closed by a seal belt, but the illustration of the seal belt is omitted. The motor 91 may be provided below each of the support columns 41 and 42 to rotate the pulley 93.

Fans 97 and 98 are provided near the upper and lower ends of the housing 40, respectively, inside the housing 40 to exhaust the inside of the housing 40. More specifically, by the fans 97 and 98 provided on the upper and lower sides inside the housing 40, respectively, the atmosphere in the transfer region 33 is absorbed into the housing 40 through the slit 96, and is exhausted to, for example, the partitioned region 47. As a result of the exhausting, the slit 96 and the inside of the housing 40 have a negative pressure with respect to the transfer region 33, and particles from the inside of the housing 40 are suppressed from scattering into the transfer region 33 through the slit 96. In a case where the fans 97 and 98 are not provided, the atmosphere in the upper and lower ends inside the housing 40 may be compressed due to the movement of the end of the slider 51 inside the housing 40 so that the pressure may easily increase, and particles may easily scatter from the upper and lower ends through the slit 96. In order to more reliably prevent the scattering of particles, the fan 97 is provided near the upper end inside the housing 40, and the fan 98 is provided near the lower end inside the housing 40. Similarly to the fan 55 of the slider 51, each of the fans 97 and 98 may be configured to include a filter to return the exhausted atmosphere to the transfer region 33.

The support column 42 is configured to be mirror-symmetric with the support column 41 in the Y direction. The end of the slider 51 on the −Y side is also configured with the connector 51B, and the connector 51B enters the housing 40 of the support column 42 through the slit 96 and is supported by the support column 42 by being locked between the belt 94 and the guide 95. The pulleys 92 and 93 of the support column 41 and the pulleys 92 and 93 of the support column 42 rotate by the motors 91 of the support columns 41 and 42, and the belts 94 of the support columns 41 and 42 are driven, so that the slider 51 moves up and down along the length direction of the guide 95. Accordingly, the pulleys 92 and 93, the belt 94, and the guide 95 make up a lifting mechanism provided in the internal space formed along the length direction of the support column 41 (the space inside the housing 40).

Figure 10:
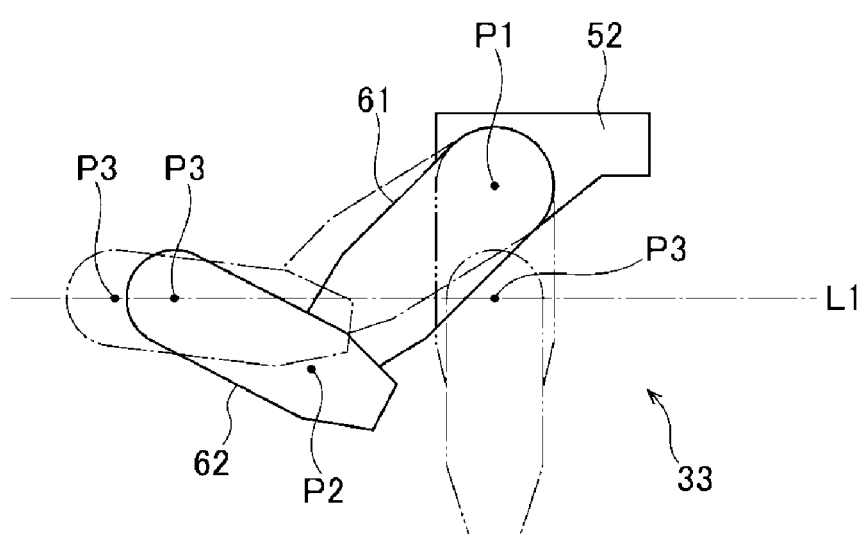
FIG. 10 is a view illustrating an operation of arms of the substrate transfer mechanism.

FIG. 10 illustrates the movement trajectory of the first arm 61 and the second arm 62 from the center of the transfer region 33 in the Y direction to the +Y side when the transfer mechanism 4B delivers the wafer W to each module, by using a solid line, an alternate long and short dash line, and an alternate lone and two short dashes line. Further, FIG. 10 illustrates the rotation center of the first arm 61 (i.e., the rotation center of the pulleys 57 and 63) as P1, the rotation center of the second arm 62 (i.e., the rotation center of the pulley 64) as P2, and the rotation center of the base 71 as P3.

As represented by the alternate long and two short dashes line in FIG. 10, when the tip end of the first arm 61 faces forward, the tip end of the second arm 62 faces rearward, and the rotation center P3 is positioned at the center of the transfer region 33 in the Y direction. In this state, as the tip end of the first arm 61 faces the end of the transfer region 33 on the +Y side, the tip end of the second arm 62 faces the +Y side (represented by the solid line and the alternate long and short dash line). In this way, when the first arm 61 and the second arm 62 move, the trajectory of the rotation center P3 substantially coincides with a virtual straight line L1 at the center of the transfer region 33 in the front-rear direction due to the gear ratio of the respective pulleys. While FIG. 10 omits the illustration of the movement trajectory of the first arm 61 and the second arm 62 on the −Y side of the transfer region 33 for the purpose of eliminating any complication in illustration, the movement trajectory is symmetric with that on the +Y side with respect to the center of the transfer region 33 in the Y direction. Accordingly, the rotation center P3 substantially coincides with the straight line L1 on the −Y side of the transfer region 33 as well as on the +Y side. The case where the rotation center P3 substantially coincides with the straight line L1 means that the distance from the straight line L1 is equal to or less than 3 mm.

Even when the position of the rotation center P3 in the front-rear direction slightly deviates at each position of the transfer region 33 in the Y direction, so that the distance from the base 71 deviates between one processing module and another processing module that face the transfer region 33, the advancing amount of the lower fork 81 and the upper fork 82 of the base 71 may be adjusted. That is, by adjusting the advancing amount, the influence of the positional deviation of the rotation center P3 is eliminated.

Descriptions will be made on the process in which the transfer mechanism 4B described above transfers the wafer W from the resist film formation module 31 to an arbitrary heating module 34. For example, it is assumed that the upper fork 82 holds the wafer W processed by the resist film formation module 31, and both the forks 81 and 82 are at the retreating position. When the slider 51 moves up and down by the motors 91 of the columns 41 and 42 so that the base 71 is positioned at the height corresponding to the heating module 34 which is the transfer destination of the wafer W, the first arm 61 and the second arm 62 rotate by the motor 53 of the arm base main body 52, and the rotation center P3 of the base 71 moves along the transfer region 33 as described above in FIG. 10, such that the base 71 is positioned in front of the heating module 34 of the transfer destination.

When the base 71 rotates by the motor 68 of the second arm 62 such that the tip ends of the forks 81 and 82 face the heating module 34, the lower fork 81 moves to the advancing position. Subsequently, the slider 51 moves up so that the wafer W processed in the heating module 34 is delivered to the lower fork 81. Then, when the lower fork 81 returns to the retreating position, the upper fork 82 moves to the advancing position, and the slider 51 moves down so that the wafer W held by the upper fork 82 is placed on the heating module 34. As described above, the valves 66A and 66B are opened/closed such that the absorption from the absorption holes 84 of the lower fork 81 is performed during the holding of the wafer W by the lower fork 81, and the absorption from the absorption holes 84 of the upper fork 82 is performed during the holding of the wafer W by the upper fork 82. When the lower fork 81 or the upper fork 82 is at the retreating position while holding the wafer W, the position detector 86 described above detects the position of the wafer W.

While the transfer of the wafer W to the heating module 34 has been described as a representative, the wafer W is transferred to another module in the same manner as described above. Depending on a module of a transfer destination of the wafer W, the wafer W may be delivered by a lifting pin provided in the module, instead of moving up and down the slider 51. Further, for example, during the operation of the substrate processing apparatus 1, the exhausting by the fans 55 of the slider 51 and the fans 97 and 98 of the support columns 41 and 42 is performed at all times, so that the scattering of particles described above is prevented.

According to the transfer mechanism 4B, the support columns 41 and 42 are fixed to the transfer region 33, and the movement of the base 71 and the forks 81 and 82 in the Y direction is implemented by the first arm 61 and the second arm 62 supported to the support columns 41 and 42 via the slider 51 and the arm base main body 52. Thus, for example, as compared with a configuration in which the support columns 41 and 42 are moved in the Y direction to implement the movement of the base 71 and the forks 81 and 82, the volume of the structure that moves in the transfer region 33 may be made relatively small, so that it may be avoided that the airflow in the transfer region 33 is disturbed by the movement of the structure, and thus, particles scatter and adhere to the wafer W. Thus, according to the transfer mechanism 4B, the wafer W may be transferred in a transversely wide range by the rotation of the first arm 61 and the second arm 62, and the reduction in yield of semiconductor devices manufactured from the wafer W may be prevented.

According to the transfer mechanism 4B, the proximal end of the first arm 61 is connected to the lower side of the arm base main body 52, the proximal end of the second arm 62 is connected to the upper side of the tip end of the first arm 61, and the forks 81 and 82 are provided on the upper side of the second arm 62 via the base 71. Thus, the thickness (vertical length) of the structure including the arm base main body 52, the first arm 61, and the second arm 62 may be reduced, and the forks 81 and 82 are disposed above the first arm 61 and the second arm 62. Since the forks 81 and 82 are disposed above the arms, particles that may be emitted and fall from, for example, the pulleys and the belts included in the first arm 61 and the second arm 62 are suppressed from adhering to the wafer W, so that the reduction in yield of semiconductor products may be more reliably prevented. The present example is also preferable because the forks 81 and 82 are also disposed above the arm base main body 52, and thus, the adhesion of particles from the arm base main body 52 to the wafer W is also suppressed. The relatively small thickness of the structure including the arm base main body 52, the first arm 61, and the second arm 62 indicates that the height of the space to which the wafer W cannot be transferred below the forks 81 and 82 is relatively small. That is, since the wafer W may be transferred in a longitudinally wide range, the degree of freedom increases in layout of the height of the modules to which the wafer W is delivered by the transfer mechanism 4B. Accordingly, the number of stacked modules such as, for example, the resist film formation modules 31 and the heating modules 34 which are arranged by being stacked may be further increased.

As illustrated in FIG. 5, the height of the upper end of the structure including the housing 52A of the arm base main body 52, the housing 61A of the first arm 61, and the housing 62A of the second arm 62 which are connected to each other (=the height of the upper surfaces of the housings 52A and 62A) is the same as the height of the upper end of the slider 51. Further, the height of the lower end of the structure (=the height of the lower surface of the housing 61A) is the same as the height of the lower end of the slider 51. Since the lower end of the structure and the lower end of the slider 51 have the height relationship described above, it is possible to prevent the structure from coming into contact with the bottom of the transfer region 33 and disturbing the downward movement of the slider 51. Further, since the upper end of the structure and the upper end of the slider 51 have the height relationship described above, the heights of the lower fork 81 and the upper fork 82 are prevented from becoming higher than the upper end of the slider 51, so that the height of the space to which the wafer W cannot be transferred below the forks 81 and 82 is reduced.

Since the height relationship between the upper end of the slider 51 and the upper end of the structure and the height relationship between the lower end of the slider 51 and the lower end of the structure are set as described above, the height range to which each of the forks 81 and 82 may access increases. Thus, the degree of freedom in layout of height of the modules further increases, so that the number of stacked modules may be increased. In order to obtain the effects described here, the height of the upper end of the structure may be lower than the height of the upper end of the slider 51, and the height of the lower end of the structure may be higher than the height of the lower end of the slider 51. That is, the height of the upper end of the structure has only to be equal to or lower than the height of the upper end of the slider 51, and the height of the lower end of the structure has only to be equal to or higher than the height of the lower end of the slider 51.

While the transfer mechanism 4B is a SCARA type transfer mechanism as described above, the tip end thereof is configured such that the forks 81 and 82 advance and retreat with respect to the base 71. With this configuration, as described above regarding the transfer of the wafer W to the heating module 34, the wafer W may be carried in/out with respect to a module by the advancing/retreating movement of the forks 81 and 82 without moving the base 71 transversely. Thus, the wafer W may be quickly carried in/out with respect to the module, so that a relatively high throughput may be obtained in the substrate processing apparatus 1. Further, since the position detector 86 is provided on the base 71, there is an advantage in that the position of the wafer W may be detected for each of the forks 81 and 82.

In the housing 70 of the base 71, the driving mechanism 7A is disposed on the right side, and the driving mechanism 7B is disposed on the left side. Further, the belt 75A and the guide 76A of the driving mechanism 7A are connected to the lower fork 81 by the connector 77A protruding to the left side of the housing 70, and the belt 75B and the guide 76B of the driving mechanism 7B are connected to the upper fork 82 by the connector 77B protruding to the right side of the housing 70. In this way, the driving mechanisms 7A and 7B are arranged on the left and right sides of the base 71, and each of the lower fork 81 and the upper fork 82 is supported only from one of the left and right sides of the base 71, so that the thickness of the base 71 may be made relatively small. More specifically, it may be assumed that each fork is connected to a driving mechanism in the housing 70 of the base 71 by connectors provided on the left and right sides of the base 71. In that case, since the connectors of the lower fork 81 and the connectors of the upper fork 82 need to have different heights in order not to interfere with the mutual operations, the thickness of the base 71 increases. Meanwhile, according to the configuration of the present disclosure, the connectors 77A and 77B do not need to have different heights, so that the thickness of the base 71 may be reduced as described above. Since the thickness of the base 71 is small, the lifting region of the forks 81 and 82 may be widened. Accordingly, the degree of freedom in layout of the height of the modules to which the wafer W is delivered by the transfer mechanism 4B may be further increased.

The lower fork 81 is supported only from the right side of the left and right sides of the base 71 by the connector 77A, and the upper fork 82 is supported only from the left side of the left and right sides of the base 71 by the connector 77B. Since the center of gravity of the connector 77A is positioned at the right end, the connector 77A is supported at the position close to the center of gravity, so that a slight tilting of the lower fork 81 connected to the connector 77A may be suppressed, and thus, the wafer W may be more reliably and stably transferred. Similarly, since the center of gravity of the connector 77B is positioned at the left end, the connector 77B is supported at the position close to the center of gravity, so that a slight tilting of the upper fork 82 connected to the connector 77B may be suppressed, and thus, the wafer W may be more reliably and stably transferred. Thus, as described above, it is preferable that the guide 76A is disposed on the right side relative to the belt 75A in the driving mechanism 7A, and the guide 76B is disposed on the left side relative to the belt 75B in the drive mechanism 7B.

Since the pressure sensors 67A and 67B disposed in the middle of the absorption pipes 85A and 85B that make up an exhaust path are provided in the second arm 62, the positions thereof are relatively close to the absorption holes 84 of the forks 81 and 82. This configuration is preferable because the followability of a detection value to the variation of absorption amount from the absorption holes 84 is relatively high, so that the presence/absence of abnormality may be detected with a high accuracy. Further, the abnormality of adsorption of the wafer W may be detected by monitoring the state of the exhaust path, and the state of the exhaust path may be, for example, the flow rate without being limited to the pressure. Thus, instead of the pressure sensors 67A and 67B, for example, flow rate sensors may be provided in the absorption pipes 85A and 85B to detect exhaust amounts.

The heating module 34 is provided with a heating plate for placing and heating the wafer W thereon, and in the resist film formation module 31, a solvent is supplied in order to improve the wettability of the surface of the wafer W before a resist is supplied. Since the motors 91 provided in the support columns 41 and 42 are arranged in the partitioned regions 47 as described above, the motors 91 are suppressed from being affected by the heat of the heating plate and are also prevented from being exposed to the solvent atmosphere. Thus, the reduction of the life of the motors 91 is prevented.

In the example of configuration described above, when the first arm 61 and the second arm 62 are moved in synchronization with each other by the motor 53, the power transmission mechanisms including belts and pulleys are used. However, the first arm 61 and the second arm 62 may be moved in synchronization with each other by using power transmission mechanism including a plurality of gears. In the example of configuration described above, the motors 91 are provided in the support columns 41 and 42, respectively. However, a motor may be provided in only one of the support columns 41 and 42. The processing modules that are stacked in the substrate processing apparatus 1 and share the transfer mechanism 4B for transferring the wafer W are not limited to the application film formation modules such as the resist film formation modules 31, or the heating modules 34 described above. The processing modules may be modules for supplying various liquids such as, for example, a developer, a cleaning liquid, and an adhesive, to the wafer W, or modules for exposing the wafer W. Additionally, the processing modules may include inspection modules for capturing images in order to detect an abnormality in the wafer W.

Second Embodiment

Figure 11:
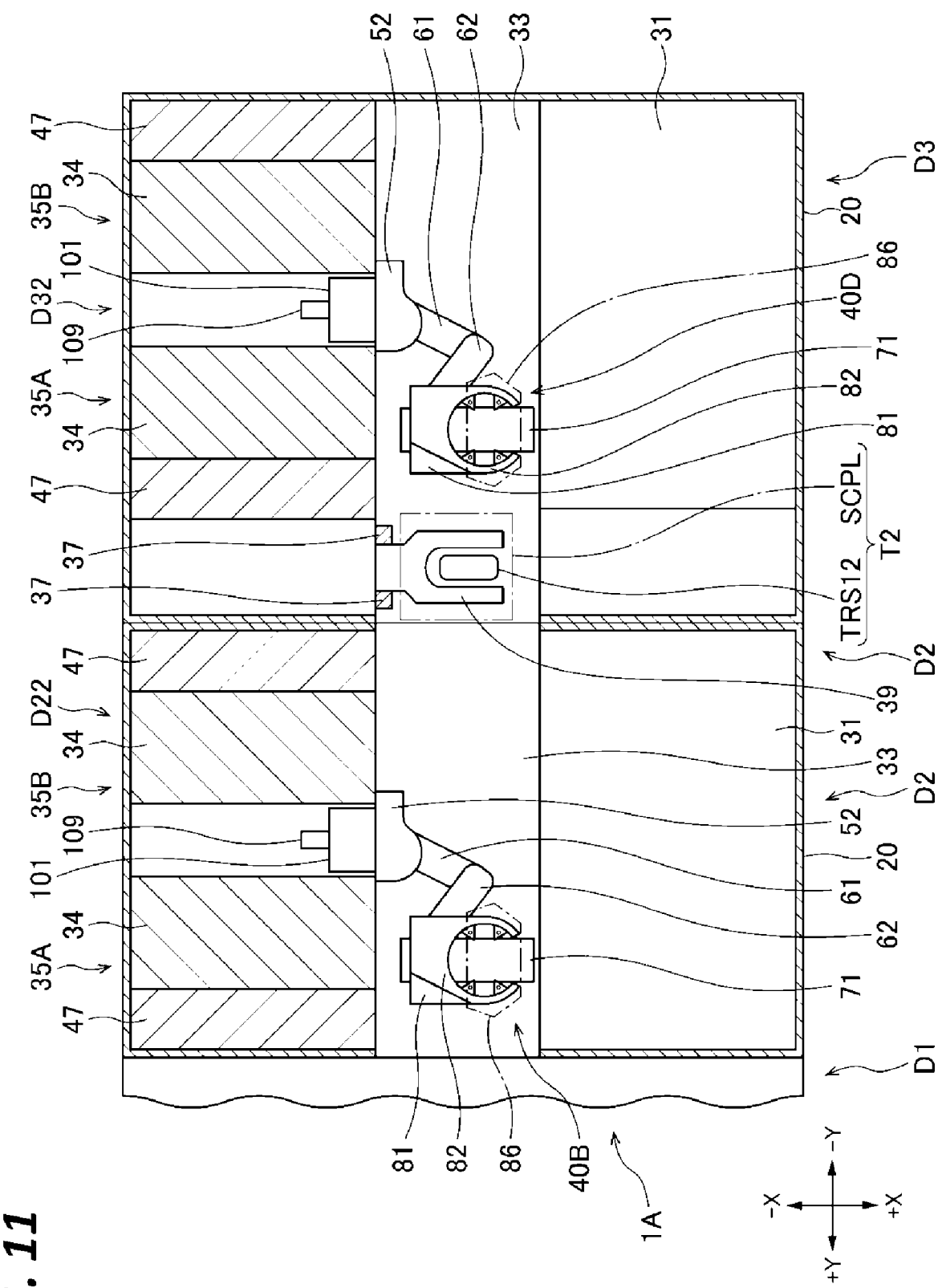
FIG. 11 is a plan view of a processing block of a substrate processing apparatus according to a second embodiment.

A substrate processing apparatus 1A according to a second embodiment will be described with reference to the plan view of FIG. 11, focusing on the differences from the substrate processing apparatus 1 of the first embodiment. In the substrate processing apparatus 1A, transfer mechanisms 40A, 40B, 40C, and 40D are provided, in place of the transfer mechanisms 4A, 4B, 4C, and 4D, respectively, and FIG. 11 illustrates the transfer mechanisms 40B and 40D. Further, the substrate processing apparatus 1A is different from the substrate processing apparatus 1 in terms of the arrangement of the modules on the −X side of the transfer region 33 in each of the processing blocks D21, D22, D31, and D32. The transfer mechanisms 40A to 40D have the same configuration, and the arrangement of the modules on the −X side is the same among the processing blocks D21, D22, D31, and D32.

Hereinafter, the first upper processing block D22 and the transfer mechanism 40B provided in the first upper processing block D22 will be described with reference to FIG. 12 which is a vertical sectional side view toward the +Y direction. As in the substrate processing apparatus 1, the seven heating modules 34 are stacked vertically on the −X side of the transfer region 33, and two stacked bodies each including the seven heating modules 34 are arranged side by side in the Y direction. Assuming that the stacked body on the +Y side is "35A," and the stacked body on the −Y side is "35B," the arrangement of the processing modules is different from that in the substrate processing apparatus 1 in that the stacked body 35A which is one of the stacked bodies is separated from the stacked body 35B which is the other stacked body, in the Y direction as illustrated in FIG. 11.

As in the substrate processing apparatus 1, the partitioned regions 47 provided with the auxiliary facilities of the modules described above are provided on the +Y side of the stacked body 35A and the −Y side of the stacked body 35B, respectively. Accordingly, the auxiliary facilities are provided in the manner that the stacked bodies 35A and 35B are sandwiched between the auxiliary facilities in the Y direction in which the stacked bodies 35A and 35B are arranged side by side. The auxiliary facility of each processing module of the stacked body 35A is provided in the partitioned region 47 on the +Y side relative to the stacked body 35A, and the auxiliary facility of each processing module of the stacked body 35B is provided in the partitioned region 47 on the −Y side relative to the stacked body 35B.

Next, the transfer mechanism 40B will be described, focusing on the differences from the transfer mechanism 4B, with reference to FIG. 13 which is a horizontal sectional plan view. As described above, the transfer mechanism 4B is configured such that the arm base main body 52 to which the arms are connected is moved up and down by using the two support columns (the support columns 41 and 42). In the transfer mechanism 40B, the arm base main body 52 is moved up and down by one support column (a support column 101 to be described later). By using one support column, it is possible to prevent an occurrence of malfunction caused from an inconsistency resulting from a distortion of each member included in one support column and each member included in the other support column. That is, according to the transfer mechanism 40B, the wafer W may be transferred to a module of a transfer destination with a relatively higher accuracy.

The transfer mechanism 40B does not include the support columns 41 and 42, the upper beam 43, the lower beam 44, and the slider 51, and includes the support column 101 instead. The support column 101 extends vertically at a position close to the +X side between the stacked bodies 35A and 35B. Accordingly, the support column 101 is provided at a position sandwiched between the stacked bodies 35A and 35B in the Y direction in which the stacked bodies 35A and 35B are arranged side by side. The arm base main body 52 is connected and supported to the side of the support column 101 on the +X side, and moves up and down along the extending direction of the support column 101 in the transfer region 33. By providing the support column 101 between the stacked bodies 35A and 35B and positioning the support columns 101 outside the transfer region 33 as described above, the increase in size of the transfer region 33 in the X direction, and furthermore, the increase in size of the substrate processing apparatus 1A is suppressed.

In the transfer mechanism 40B, the fans 55 are provided inside the housing 52A of the arm base main body 52, rather than inside the slider 51, and the inside of the housing 52A, the inside of the housing 61A of the first arm 61, and the inside of the housing 62A of the second arm 62 which communicate with each other as described above are collectively absorbed by the fans 55. Further, the housing 52A is provided with a filter 50, and the atmosphere absorbed by the fans 55 is discharged to the outside of the housing 52A, that is, to the transfer region 33 through the filter 50.

Figure 14:
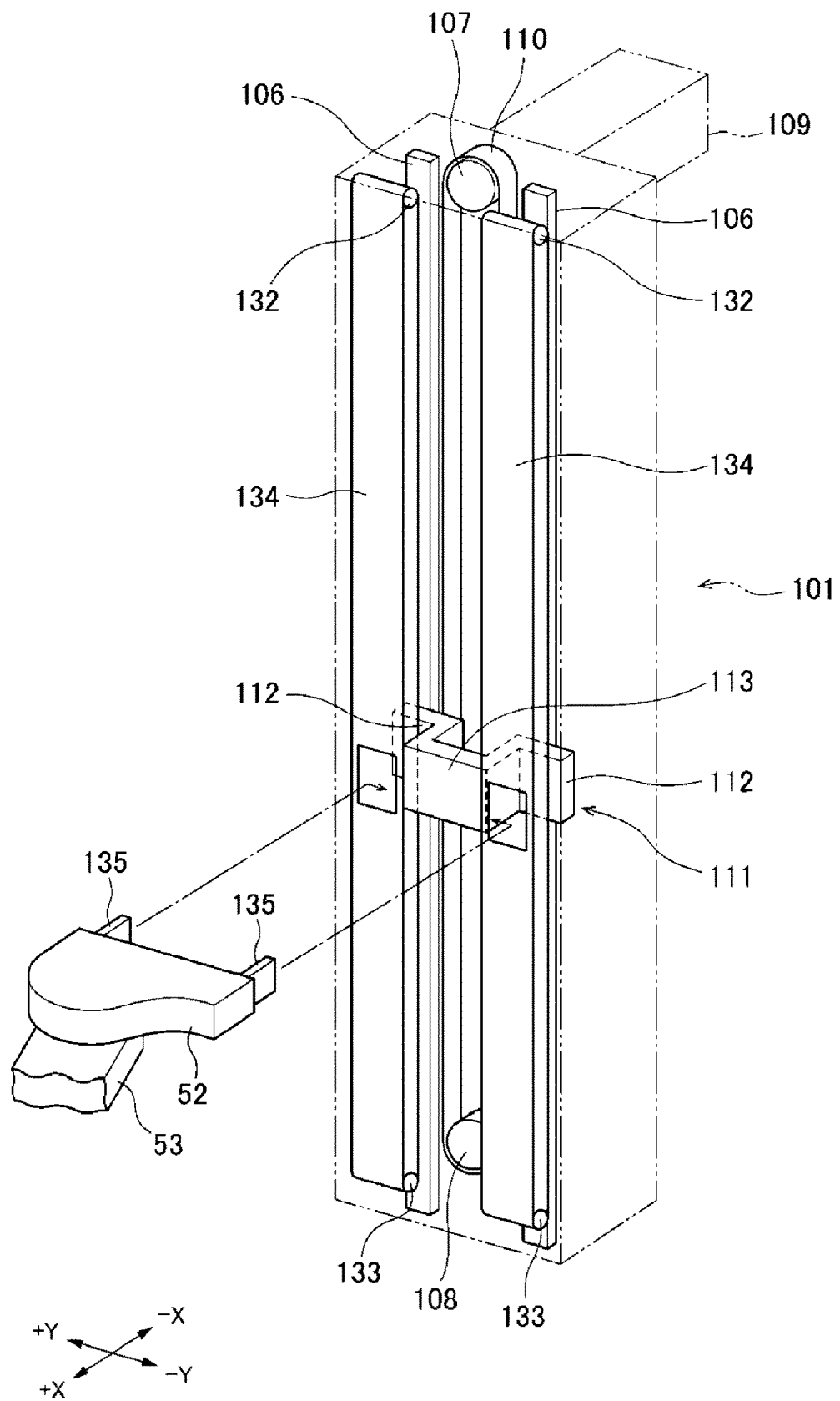
FIG. 14 is a perspective view of the substrate transfer mechanism.

Next, the configuration of the support column 101 in the transfer mechanism 40B will be described with reference to FIG. 14 which is a schematic perspective view of the components inside the support column 101. The support column 101 includes a housing 102, and is provided with a partition plate 103 that partitions the inside of the housing 102 into two spaces in the X direction. Of the spaces partitioned by the partition plate 103, the space on the +X side is illustrated as a front space 104, and the space on the −X side is illustrated as a rear space 105. Two guide rails 106 are provided on the side of the partition plate 103 that faces the front space 104 at an interval in the Y direction, and each extend vertically, that is, longitudinally. Thus, assuming that the side of the support column 101 on the +X side on which the arm base main body 52 is provided is the front side, the guide rails 106 are arranged side by side in the left-right direction.

Pulleys 107 and 108 are provided between the two guide rails 106 arranged in the Y direction. The pulleys 107 and 108 are disposed at the upper and lower ends of the front space 104, respectively, and may each rotate around an axis extending in the X direction. An endless belt 110 wraps around the pulleys 107 and 108. A motor 109 which is a fourth driver is provided to protrude from the upper end of the housing 102 in the −X direction. Thus, the motor 109 is also sandwiched between the stacked bodies 35A and 35B similarly to the support column 101, and connected to the pulley 107.

A slider 111 is provided in the front space 104. The slider 111 includes two sliding portions 112 connected to the guide rails 106, respectively, and a main portion 113 forming a concave portion opened toward the −X side in a plan view. The sliding portions 112 are each formed to expand from the edge of the concave portion toward the outside of the concave portion in a plan view. The belt 108 is fitted in the concave portion formed by the main portion 113 in the plan view as described above, and the belt 108 and the main portion 113 are connected to each other. With this configuration, the belt 108 rotates by the motor 109, and the slider 111 moves up and down along the guide rails 106. Since the slider 111 connected to the two guide rails 106 is moved up and down by one motor 109, the motor 109 is a driver shared by the two guide rails 106.

Two slits 131 are formed in the side surface of the housing 102 on the +X side (the side surface facing the transfer region 33) to be opened toward the front space 104, and each extend vertically. The two slits 131 are arranged apart from each other in the Y direction, and face the guide rails 106, respectively. Rollers 132 and 133 are provided at the upper and lower ends of the front space 104, respectively, and two rollers 132 and 133 and the remaining two rollers 132 and 133 are provided apart from each other in the Y direction to be arranged side by side in the vertical direction. The rollers 132 and 133 may each rotate around an axis extending in the Y direction. An endless seal belt 134 wraps around each set of the rollers 132 and 133 arranged side by side in the vertical direction, while closing each slit 131. A portion of each seal belt 134 is opened, and the slider 111 and the arm base main body 52 are connected to each other via a connecting member 135 provided in the opening. Accordingly, in synchronization with the upward/downward movement of the slider 111, the arm base main body 52 moves up and down along the extending direction of the guide rails 106. In the present embodiment, the support column 101 and the motor 109 correspond to a lift, and the arm base main body 52 corresponds to a base that moves up and down by the lift.

The first arm 61, the second arm 62, and the base 71 described above are supported by the arm base main body 52 connected to the slider 111. For the purpose of suppressing the load of the guide rails 106 received by supporting the plurality of members so as to increase the life of the guide rails 106, the configuration in which the plurality of guide rails 106 are arranged side by side in the Y direction as described above is preferable. From a different point of view, when the plurality of guide rails 106 are provided as described above, the slider 111 may be moved up and down even in the configuration where one support column is provided, so that the installation space for the support column is reduced. Thus, providing the plurality of guide rails 106 contributes to the reduction of the occupied floor area of the substrate processing apparatus 1A. For the purpose of obtaining the effects, two or more guide rails 106 may be provided.

Figure 12:
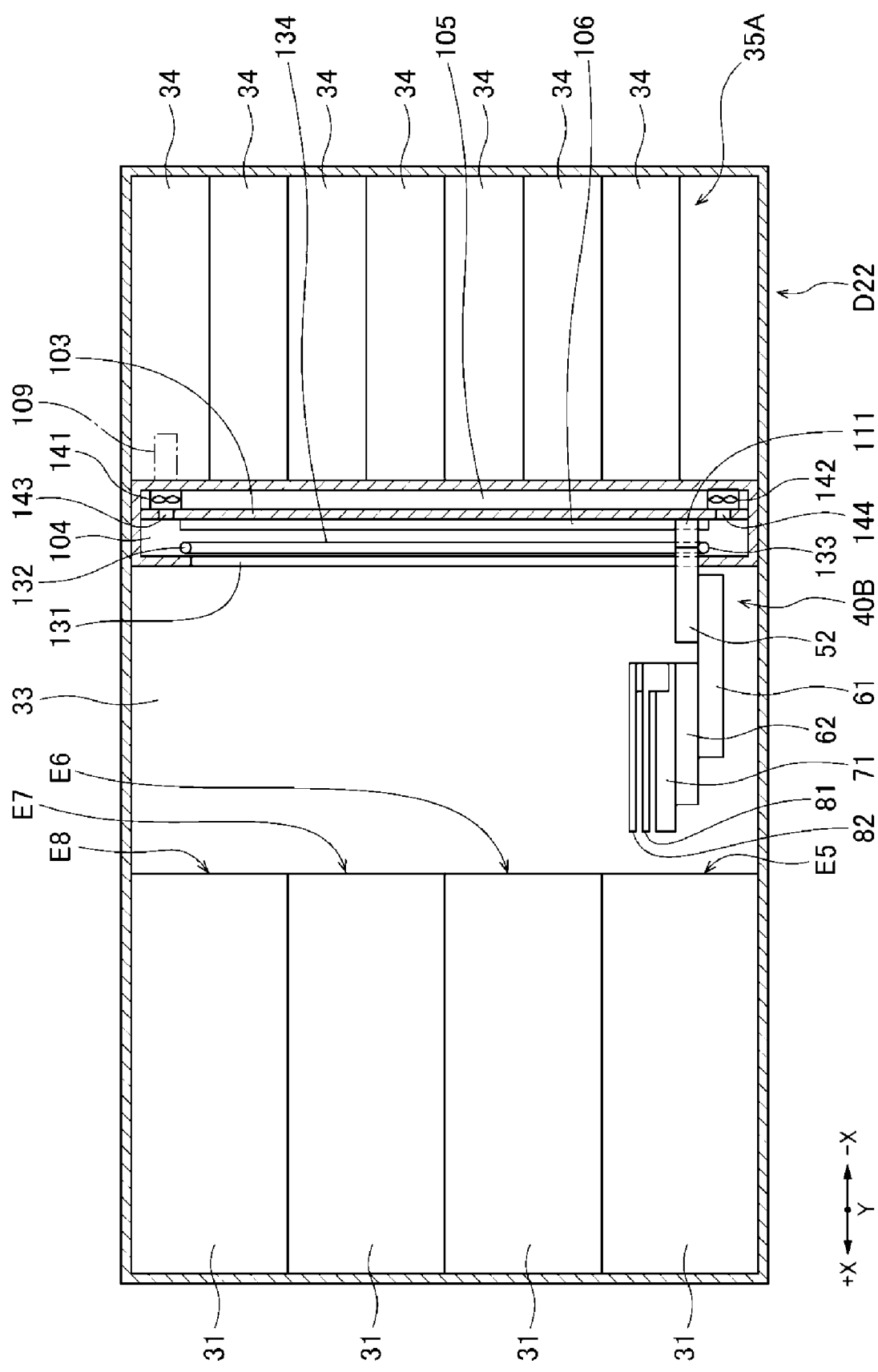
FIG. 12 is a side view of the processing block according to the second embodiment.
Figure 13:
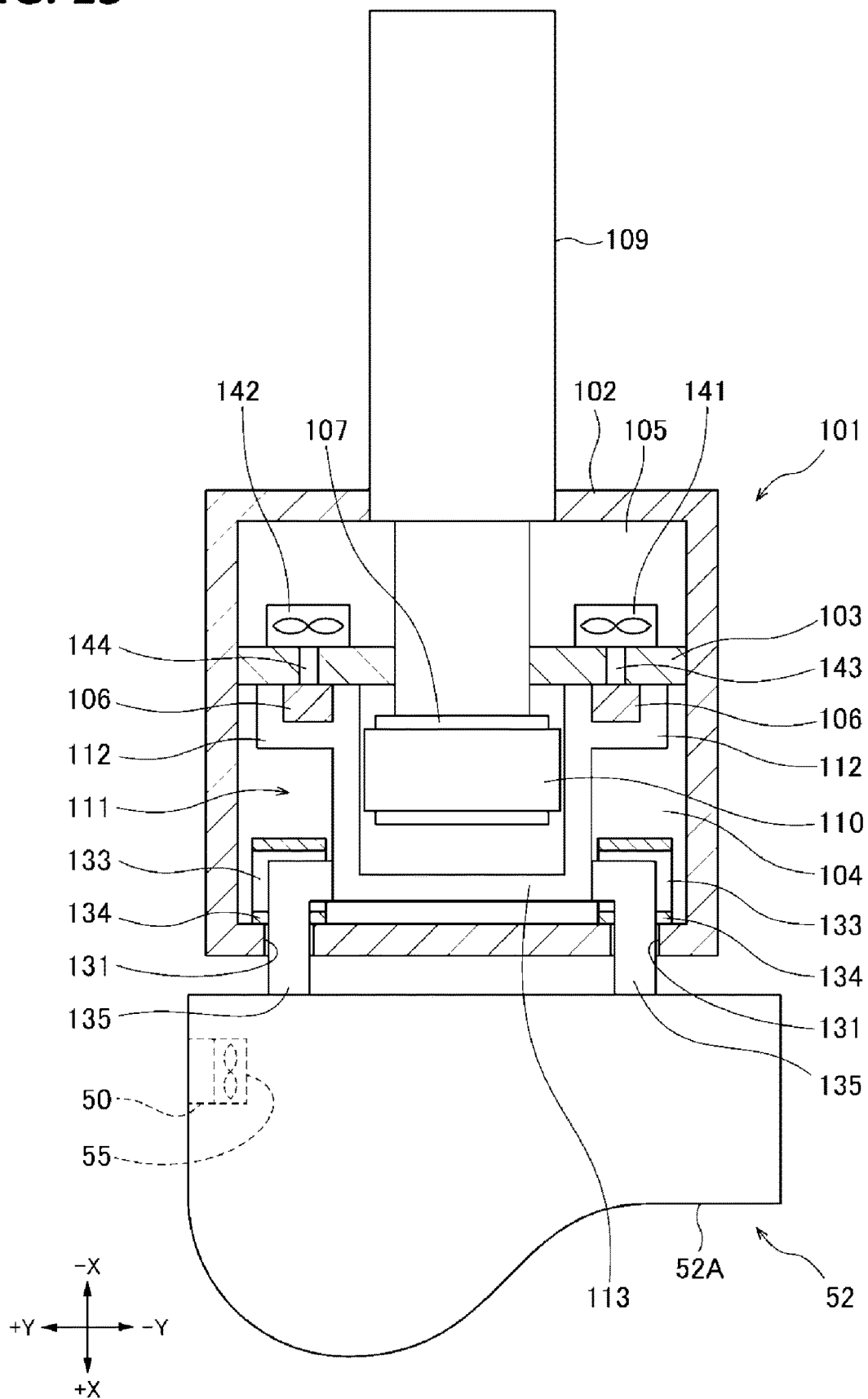
FIG. 13 is a horizontal sectional plan view of a substrate transfer mechanism provided in the apparatus of the second embodiment.

As illustrated in FIGS. 12 and 13, fans 141 and 142 are provided at the upper and lower ends of the rear space 105, respectively, and positioned on the −Y and the +Y side, respectively, relative to the position where the belt 110 is provided. In the partition plate 103, holes 143 and 144 are formed at the positions facing the fans 141 and 142, respectively. By the fans 141 and 142, the atmosphere in the transfer region 33 flows into the front space 104 through the gaps between the seal belts 134 and the opening edges of the slits 131, flows through the holes 143 and 144, and merges in the rear space 105. Further, the housing 102 is provided with an exhaust path (not illustrated) connected to the rear space 105, such that the atmosphere flowing into the rear space 105 flows into the exhaust path and is removed.

The air flow is formed to flow from the transfer region 33 toward the rear space 105 as described above, so that particles generated in each member provided in the front space 104 are prevented from being discharged to the transfer region 33 through the gaps between the seal belts 134 and the opening edges of the slits 131. In addition to the fans 141 and 142, various cables for driving each part of the transfer mechanism 4B and members for bundling, protecting, and guiding the cables are provided in the rear space 105, but the illustration thereof is omitted. The first upper processing block D22 and the transfer mechanism 40B described above are used, and in the substrate processing apparatus 1A, the wafer W is transferred through the same transfer route as that in the substrate processing apparatus 1 to be subjected to a processing.

Due to the transfer route described above, in the substrate processing apparatus 1A, the wafer W is delivered between the processing blocks adjacent to each other in the Y direction, and thus, the wafer W transferred to the first upper processing block D22 moves between one end of the transfer region 33 and the other end thereof in the Y direction. The substrate processing apparatus may not be configured such that the processing blocks are adjacent to each other in the Y direction. For example, the apparatus may have a transfer route in which the wafer W transferred from the carrier block D1 to the first upper processing block D22 is returned to the carrier block D1 after being processed in the processing modules of the stacked bodies 35A and 35B.

In such an apparatus configuration, the wafer W may not be moved to the end of the transfer region 33 on the −Y side when the wafer W is delivered to the processing modules of the stacked bodies 35A and 35B, because the apparatus has the layout in which the stacked bodies 35A and 35B are sandwiched between the two partition regions 47 each provided with the auxiliary facilities as described above. Further, it is assumed that the apparatus has the transfer route in which the wafer W is transferred between the processing modules of the stacked body 35A and the processing modules of the stacked body 35B to be subjected to a processing. In the layout described above, only the support column 101 is interposed between the stacked bodies 35A and 35B, and the stacked bodies 35A and 35B are close to each other. Accordingly, the time for the transfer between the processing modules of the stacked body 35A and the processing modules of the stacked body 35B may be reduced. By adopting the layout described above for the partitioned regions 47 and the stacked bodies 35A and 35B, the throughput of the substrate processing apparatus may be improved.

Figure 15:
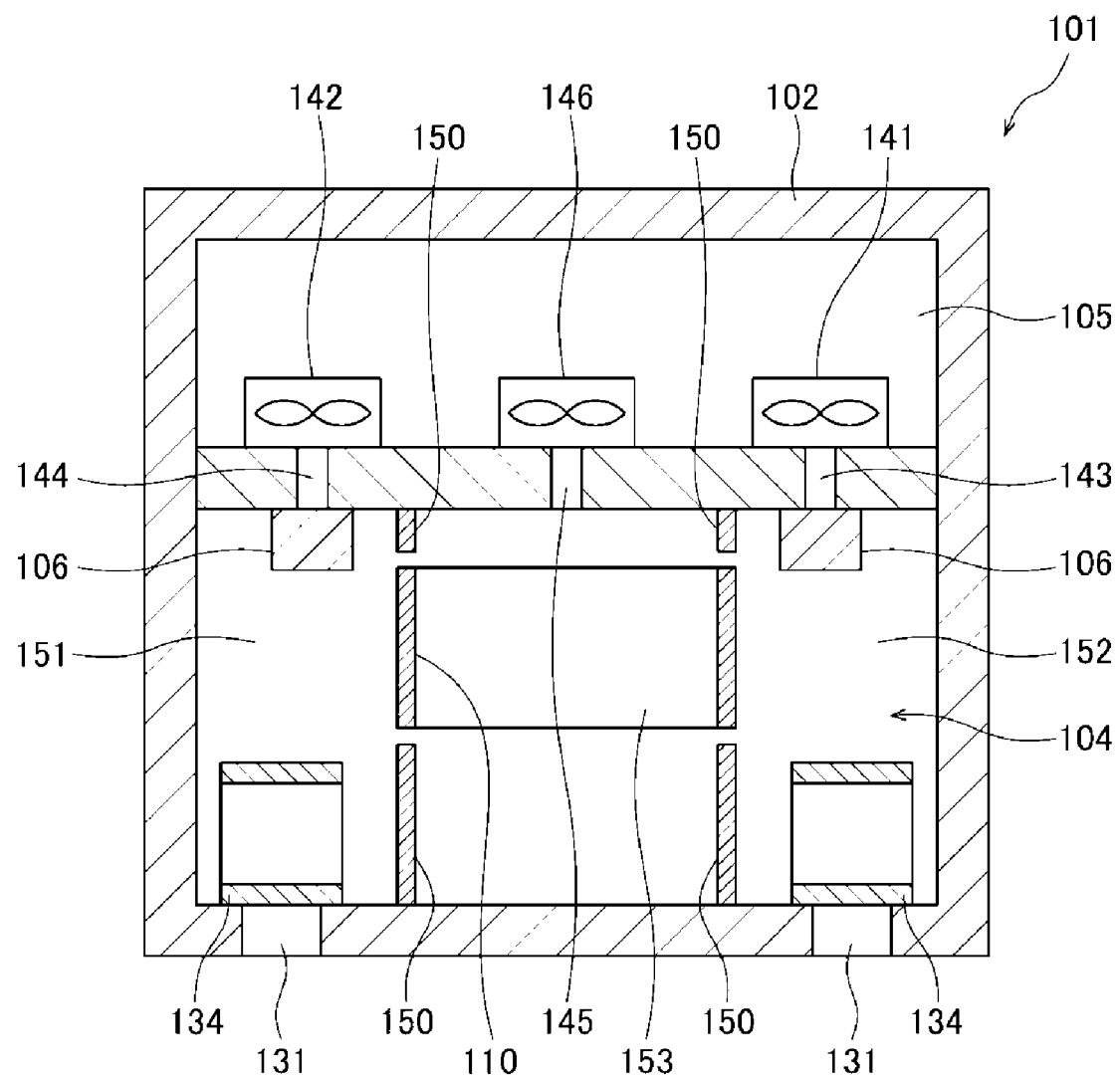
FIG. 15 is a horizontal sectional plan view illustrating a modification of the substrate transfer mechanism.

Next, FIG. 15 will be described. FIG. 15 is a horizontal sectional plan view illustrating a modification of the support column 101 of the transfer mechanism 4B. In the front space 104 of the support column 101, partition members 150 are provided to approach the belt 110 from the X direction, and the front space 104 is partitioned into three partitioned regions 151, 152, and 153 by the partition members 150. The regions 151 and 152 are regions outside the annular belt 110, and include the guide rails 106, respectively. The holes 143 and 144 are opened in the partitioned regions 151 and 152, respectively, so that exhausting is performed from each of the fans 141 and 142. The partitioned region 153 is surrounded by the belt 110, and a hole 145 is formed in the partition plate 103 to be opened to the partitioned region 153. A fan 146 is provided in the rear space 105 to face the hole 145, so that the partitioned region 153 is exhausted through the hole 145.

In the modification described above, the fans 141, 142, and 146 which are exhaust mechanisms are provided to correspond to the partitioned regions 151, 152, and 153, respectively. Since the partitioned region 153 may also be exhausted by the fans 141 and 142 through the gaps between the belt 110 and the partition members 150, the fan 146 may not be provided. In that case as well, the fans 141 and 142 which are exhaust mechanisms are provided to correspond to the partitioned regions 151 and 152, respectively. In this way, by adopting the configuration in which the inside of the housing 102 is partitioned in a plurality of regions, and exhaust mechanisms corresponding to the partitioned regions, respectively, are provided to perform the exhausting, the exhausting efficiency in each portioned region is improved, so that the discharge of particles from the inside of the housing 102 to the transfer region 33 is more reliably suppressed.

According to the present disclosure, when a substrate is delivered to stacked processing modules by a substrate transfer mechanism, the substrate may be transferred in a wide range while suppressing the adhesion of particles to the substrate.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate transfer device comprising:
an arm base main body provided with a first driver;
a lift configured to move up and down the arm base main body;
a first arm extending transversely from a lower side of the arm base main body, and having a tip end that pivots around a vertical axis with respect to the arm base main body by the first driver;
a second arm extending transversely from an upper side of the tip end of the first arm, and having a tip end that pivots around a vertical axis with respect to the first arm along with the pivoting of the first arm; and
a substrate holder provided on an upper side of the tip end of the second arm, and configured to hold a substrate and rotate around a vertical axis with respect to the second arm, thereby transferring the substrate to one of a plurality of stacked processing modules that process the substrate wherein:
the arm base main body protrudes transversely from an upper portion of a slider,
a proximal end of the first arm is connected to a lower side of the arm base main body,
the slider, the arm base main body, the first arm, and the second arm include a housing for the slider, a housing for the arm base main body, a housing for the first arm, and a housing for the second arm, respectively,
a communication path is provided to communicate an inside of the housing for the slider, an inside of the housing for the arm base main body, an inside of the housing for the first arm, and an inside of the housing for the second arm with each other, and
a second exhaust fan is provided in the slider to exhaust the inside of the housing for the slider, the inside of the housing for the arm base main body, the inside of the housing for the first arm, and the inside of the housing for the second arm, through the communication path.

2. The substrate transfer device according to claim 1, wherein
a base is provided on the upper side of the tip end of the second arm to rotate around a vertical axis with respect to the second arm, and
the substrate holder is configured to advance and retreat with respect to the base on an upper side of the base.

3. The substrate transfer device according to claim 2, wherein
the substrate holder includes a first holder and a second holder arranged longitudinally and each configured to hold a single substrate,
when an advancing/retreating direction of the first holder and the second holder is a front-rear direction, a first mover configured to move the first holder in the front-rear direction and a second mover configured to move the second holder in the front-rear direction are provided on a left side and a right side of the base, respectively, inside the base, and
a first connector is provided on only one side of the left and right sides of the base to connect the first holder to the first mover, and a second connector is provided on only a remaining side of the left and right sides of the base to connect the second holder to the second mover.

4. The substrate transfer device according to claim 2, wherein the substrate holder includes absorption holes for absorbing and holding the substrate, and a sensor is provided in the second arm to detect a state of an exhaust path connected to the absorption holes.

5. The substrate transfer device according to claim 1, wherein
the stacked processing modules form one stacked body and another stacked body that are transversely separated from each other, and
the lift is sandwiched between the two stacked bodies.

6. The substrate transfer device according to claim 1, wherein
a base is provided on the upper side of the tip end of the second arm to rotate around a vertical axis with respect to the second arm, the substrate holder is configured to advance and retreat with respect to the base on an upper side of the base, and the base includes a third driver configured to advance and retreat the substrate holder,
the arm base main body, the first arm, and the second arm include a housing for the arm base main body, a housing for the first arm, and a housing for the second arm, respectively, configured to accommodate cables connected to the third driver,
an upper end of the housing for the second arm and an upper end of the housing for the arm base main body are positioned at a height equal to or lower than an upper end of the slider, and
a lower end of the housing for the first arm is positioned at a height equal to or higher than a lower end of the slider.

7. The substrate transfer device according to claim 1, wherein
the stacked processing modules form one stacked body and another stacked body that are arranged side by side transversely, and
auxiliary facilities of the processing modules are provided in a manner that the two stacked bodies are sandwiched between the auxiliary facilities in a direction in which the two stacked bodies are arranged side by side.

8. A substrate transferring method comprising:
providing a substrate transfer device including:
- an arm base main body provided with a first driver, the arm base main body protruding transversely from an upper portion of a slider;
- a lift configured to move up and down the arm base main body;
- a first arm extending transversely from a lower side of the arm base main body, the first arm having a proximal end that is connected to the lower side of the arm base main body, and having a tip end that pivots around a vertical axis with respect to the arm base main body by the first driver;
- a second arm extending transversely from an upper side of the tip end of the first arm, and having a tip end that pivots around a vertical axis with respect to the first arm along with the pivoting of the first arm;
- a housing for the slider;
- a housing for the arm base main body;
- a housing for the first arm;
- a housing for the second arm;
- a substrate holder provided on an upper side of the tip end of the second arm, and configured to hold a substrate and rotate around a vertical axis with respect to the second arm moving up and down the arm base main body;
- a communication path is provided to communicate an inside of the housing for the slider, an inside of the housing for the arm base main body, an inside of the housing for the first arm, and an inside of the housing for the second arm with each other; and
- a second exhaust fan is provided in the slider to exhaust the inside of the housing for the slider, the inside of the housing for the arm base main body, the inside of the housing for the first arm, and the inside of the housing for the second arm, through the communication path;

causing the tip end of the first arm to pivot around the vertical axis with respect to the arm base main body by the first driver;

causing the tip end of the second arm to pivot around the vertical axis with respect to the first arm along with the pivoting of the first arm; and causing the substrate holder to rotate around the vertical axis with respect to the second arm, thereby transferring the substrate to one of a plurality of stacked processing modules that process the substrate.

* * * * *